(12) United States Patent
Teig et al.

(10) Patent No.: US 10,719,762 B2
(45) Date of Patent: Jul. 21, 2020

(54) THREE DIMENSIONAL CHIP STRUCTURE IMPLEMENTING MACHINE TRAINED NETWORK

(71) Applicant: Xcelsis Corporation, San Jose, CA (US)

(72) Inventors: Steven L. Teig, Menlo Park, CA (US);
Kenneth Duong, San Jose, CA (US);
Javier DeLaCruz, San Jose, CA (US)

(73) Assignee: XCELSIS CORPORATION, San Jose, CA (US)

( * ) Notice: Subject to any disclaimer, the term of this patent is extended or adjusted under 35 U.S.C. 154(b) by 217 days.

(21) Appl. No.: 15/859,548

(22) Filed: Dec. 31, 2017

(65) Prior Publication Data

US 2019/0043832 A1 Feb. 7, 2019

Related U.S. Application Data

(60) Provisional application No. 62/541,064, filed on Aug. 3, 2017.

(51) Int. Cl.
*H01L 23/31* (2006.01)
*H01L 25/065* (2006.01)
(Continued)

(52) U.S. Cl.
CPC ....... *G06N 3/0635* (2013.01); *G06F 11/1423* (2013.01); *G06F 11/2007* (2013.01);
(Continued)

(58) Field of Classification Search
CPC ............ H01L 23/3128; H01L 25/0657; G06N 3/0635; G06N 3/04; G06N 3/0481;
(Continued)

(56) References Cited

U.S. PATENT DOCUMENTS 5,016,138 A * 5/1991 Woodman ........... H01L 23/5385
174/252
5,376,825 A 12/1994 Tukamoto et al.
(Continued)

FOREIGN PATENT DOCUMENTS

WO 2019079625 A1 4/2019
WO 2019079631 A1 4/2019

OTHER PUBLICATIONS

Author Unknown, "Fact Sheet: New Intel Architectures and Technologies Target Expanded Market Opportunities," Dec. 12, 2018, 9 pages, Intel Corporation, Santa Clara, California.
(Continued)

*Primary Examiner* — Ida M Soward
(74) *Attorney, Agent, or Firm* — Adeli LLP

(57) ABSTRACT

Some embodiments provide a three-dimensional (3D) circuit structure that has two or more vertically stacked bonded layers with a machine-trained network on at least one bonded layer. As described above, each bonded layer can be an IC die or an IC wafer in some embodiments with different embodiments encompassing different combinations of wafers and dies for the different bonded layers. The machine-trained network in some embodiments includes several stages of machine-trained processing nodes with routing fabric that supplies the outputs of earlier stage nodes to drive the inputs of later stage nodes. In some embodiments, the machine-trained network is a neural network and the processing nodes are neurons of the neural network. In some embodiments, one or more parameters associated with each processing node (e.g., each neuron) is defined through machine-trained processes that define the values of these parameters in order to allow the machine-trained network (e.g., neural network) to perform particular operations (e.g., face recognition, voice recognition, etc.). For example, in some embodiments, the machine-trained parameters are
(Continued)

weight values that are used to aggregate (e.g., to sum) several output values of several earlier stage processing nodes to produce an input value for a later stage processing node.

21 Claims, 11 Drawing Sheets

(51) Int. Cl.
  G06N 3/06 (2006.01)
  G06N 3/04 (2006.01)
  G06N 3/08 (2006.01)
  G06F 11/14 (2006.01)
  G06F 11/20 (2006.01)
  G06N 3/063 (2006.01)
  H01L 23/00 (2006.01)
  H03K 19/21 (2006.01)

(52) U.S. Cl.
  CPC ...... *G06F 11/2028* (2013.01); *G06F 11/2041* (2013.01); *G06F 11/2051* (2013.01); *G06N 3/04* (2013.01); *G06N 3/0481* (2013.01); *G06N 3/063* (2013.01); *G06N 3/08* (2013.01); *G06N 3/082* (2013.01); *G06N 3/084* (2013.01); *H01L 23/3128* (2013.01); *H01L 25/0657* (2013.01); *G06F 2201/85* (2013.01); *H01L 24/16* (2013.01); *H01L 24/17* (2013.01); *H01L 2224/16145* (2013.01); *H01L 2224/16225* (2013.01); *H01L 2224/16227* (2013.01); *H01L 2224/17181* (2013.01); *H01L 2225/06513* (2013.01); *H01L 2225/06517* (2013.01); *H01L 2225/06524* (2013.01); *H01L 2225/06541* (2013.01); *H01L 2225/06565* (2013.01); *H01L 2225/06582* (2013.01); *H01L 2225/06586* (2013.01); *H01L 2924/16235* (2013.01); *H03K 19/21* (2013.01)

(58) Field of Classification Search
  CPC .......... G06N 3/063; G06N 3/08; G06N 3/082; G06N 3/084; G06F 11/1423; G06F 11/2007; G06F 11/2028; G06F 11/2041; G06F 11/2051
  See application file for complete search history.

(56) References Cited

U.S. PATENT DOCUMENTS

| | | | |
|---|---|---|---|
| 5,579,207 A * | 11/1996 | Hayden | H01L 25/0657 174/261 |
| 5,621,863 A | 4/1997 | Boulet et al. | |
| 5,673,478 A | 10/1997 | Beene et al. | |
| 5,717,832 A | 2/1998 | Steimle et al. | |
| 5,740,326 A | 4/1998 | Boulet et al. | |
| 5,793,115 A * | 8/1998 | Zavracky | H01L 23/49833 257/774 |
| 5,909,587 A | 6/1999 | Tran | |
| 6,320,255 B1 * | 11/2001 | Terrill | H01L 21/28562 257/686 |
| 6,421,654 B1 | 7/2002 | Gordon | |
| 6,707,124 B2 | 3/2004 | Wachtler et al. | |
| 6,844,624 B1 | 1/2005 | Kiritani | |
| 6,891,447 B2 * | 5/2005 | Song | H01L 23/48 257/E23.01 |
| 6,909,194 B2 | 6/2005 | Farnworth et al. | |
| 6,917,219 B2 | 7/2005 | New | |
| 7,046,522 B2 | 5/2006 | Sung et al. | |
| 7,099,215 B1 | 8/2006 | Rotenberg et al. | |
| 7,124,250 B2 | 10/2006 | Kyung | |
| 7,202,566 B2 * | 4/2007 | Liaw | H01L 23/50 257/690 |
| 7,638,869 B2 | 12/2009 | Irsigler et al. | |
| 7,692,946 B2 | 4/2010 | Taufique et al. | |
| 7,863,918 B2 * | 1/2011 | Jenkins | G01R 31/2884 324/750.3 |
| 8,032,711 B2 | 10/2011 | Black et al. | |
| 8,110,899 B2 | 2/2012 | Reed et al. | |
| 8,148,814 B2 | 4/2012 | Furuta et al. | |
| 8,432,467 B2 | 4/2013 | Jaworski et al. | |
| 8,516,409 B2 | 8/2013 | Coteus et al. | |
| 8,546,955 B1 | 10/2013 | Wu | |
| 8,547,769 B2 | 10/2013 | Saraswat et al. | |
| 8,704,384 B2 | 4/2014 | Wu et al. | |
| 8,736,068 B2 | 5/2014 | Bartley et al. | |
| 8,797,818 B2 | 8/2014 | Jeddeloh | |
| 8,816,506 B2 | 8/2014 | Kawashita et al. | |
| 8,860,199 B2 | 10/2014 | Black et al. | |
| 8,907,439 B1 | 12/2014 | Kay et al. | |
| 8,930,647 B1 | 1/2015 | Smith | |
| 9,067,272 B2 * | 6/2015 | Sutanto | B23K 1/20 |
| 9,076,700 B2 | 7/2015 | Kawashita et al. | |
| 9,142,262 B2 * | 9/2015 | Ware | G11C 5/04 |
| 9,300,298 B2 * | 3/2016 | Cordero | H03K 19/17796 |
| 9,318,418 B2 | 4/2016 | Kawashita et al. | |
| 9,432,298 B1 * | 8/2016 | Smith | H04L 49/9057 |
| 9,478,496 B1 | 10/2016 | Lin | |
| 9,497,854 B2 | 11/2016 | Giuliano | |
| 9,501,603 B2 | 11/2016 | Barowski et al. | |
| 9,508,607 B2 * | 11/2016 | Chua-Eoan | H01L 23/34 |
| 9,640,233 B2 | 5/2017 | Sohn | |
| 9,645,603 B1 | 5/2017 | Chall et al. | |
| 9,647,187 B1 | 5/2017 | Yap et al. | |
| 9,691,739 B2 | 6/2017 | Kawashita et al. | |
| 9,726,691 B2 * | 8/2017 | Garibay | G01R 31/318513 |
| 9,746,517 B2 | 8/2017 | Whetsel | |
| 9,915,978 B2 | 3/2018 | Dabby et al. | |
| 10,121,743 B2 * | 11/2018 | Kamal | H01L 23/5286 |
| 10,255,969 B2 | 4/2019 | Eom et al. | |
| 10,262,911 B1 * | 4/2019 | Gong | H01L 25/0652 |
| 10,269,586 B2 | 4/2019 | Chou et al. | |
| 10,373,657 B2 | 8/2019 | Kondo et al. | |
| 10,446,207 B2 | 10/2019 | Kim et al. | |
| 10,446,601 B2 | 10/2019 | Otake et al. | |
| 10,580,817 B2 | 3/2020 | Otake et al. | |
| 2001/0017418 A1 | 8/2001 | Noguchi et al. | |
| 2005/0127490 A1 | 6/2005 | Black et al. | |
| 2006/0036559 A1 | 2/2006 | Nugent | |
| 2007/0220207 A1 | 9/2007 | Black et al. | |
| 2009/0070727 A1 | 3/2009 | Solomon | |
| 2010/0140750 A1 | 6/2010 | Toms | |
| 2012/0201068 A1 | 8/2012 | Ware | |
| 2012/0242346 A1 * | 9/2012 | Wang | G01R 31/318513 324/537 |
| 2013/0051116 A1 | 2/2013 | En et al. | |
| 2013/0144542 A1 * | 6/2013 | Ernst | B81C 1/00238 702/23 |
| 2013/0187292 A1 * | 7/2013 | Semmelmeyer | H01L 25/0652 257/777 |
| 2013/0207268 A1 | 8/2013 | Chapelon | |
| 2013/0275823 A1 | 10/2013 | Cordero et al. | |
| 2014/0022002 A1 | 1/2014 | Chua-Eoan et al. | |
| 2014/0323046 A1 * | 10/2014 | Asai | H01Q 1/2283 455/41.2 |
| 2015/0228584 A1 | 8/2015 | Huang et al. | |
| 2016/0111386 A1 | 4/2016 | England et al. | |
| 2016/0225431 A1 | 8/2016 | Best et al. | |
| 2016/0233134 A1 | 8/2016 | Lim et al. | |
| 2016/0329312 A1 | 11/2016 | O'Mullan et al. | |
| 2016/0379115 A1 * | 12/2016 | Burger | G06N 3/08 706/25 |
| 2017/0092615 A1 | 3/2017 | Oyamada | |
| 2017/0092616 A1 | 3/2017 | Su et al. | |
| 2017/0148737 A1 | 5/2017 | Fasano et al. | |
| 2017/0213787 A1 | 7/2017 | Alfano et al. | |
| 2017/0278213 A1 * | 9/2017 | Eckert | G06T 1/20 |
| 2017/0278789 A1 * | 9/2017 | Chuang | G06F 30/392 |
| 2017/0285584 A1 | 10/2017 | Nakagawa et al. | |
| 2017/0301625 A1 | 10/2017 | Mahajan et al. | |

(56) References Cited

U.S. PATENT DOCUMENTS

| | | | |
|---|---|---|---|
| 2018/0017614 A1* | 1/2018 | Leedy | G01R 31/2894 |
| 2018/0286800 A1 | 10/2018 | Kamal et al. | |
| 2018/0330992 A1 | 11/2018 | Delacruz et al. | |
| 2018/0330993 A1 | 11/2018 | Delacruz et al. | |
| 2018/0331037 A1 | 11/2018 | Mohammed et al. | |
| 2018/0331038 A1 | 11/2018 | Delacruz et al. | |
| 2018/0331072 A1 | 11/2018 | Nequist et al. | |
| 2018/0331094 A1 | 11/2018 | Delacruz et al. | |
| 2018/0331095 A1 | 11/2018 | Delacruz et al. | |
| 2018/0350775 A1* | 12/2018 | DeLaCruz | H01L 24/05 |
| 2018/0373975 A1 | 12/2018 | Yu et al. | |
| 2019/0042377 A1 | 2/2019 | Teig et al. | |
| 2019/0042912 A1 | 2/2019 | Teig et al. | |
| 2019/0042929 A1 | 2/2019 | Teig et al. | |
| 2019/0051641 A1 | 2/2019 | Lee et al. | |
| 2019/0123022 A1 | 4/2019 | Teig et al. | |
| 2019/0123023 A1 | 4/2019 | Teig et al. | |
| 2019/0123024 A1 | 4/2019 | Teig et al. | |
| 2019/0244933 A1* | 8/2019 | Or-Bach | H01L 25/167 |
| 2020/0013699 A1* | 1/2020 | Liu | H01L 23/473 |

OTHER PUBLICATIONS

Author Unknown, "Vector Supercomputer SX Series: SX-Aurora TSUBASA," Oct. 2017, 2 pages, NEC Corporation.

Bansal, Samta, "3D-IC is Now Real: Wide-IO is Driving 3D-IC TSV," Cadence Flash Memory Summit, Aug. 2012, 14 pages, Cadence Design Systems, Inc.

Black, Bryan, "Die Stacking is Happening!," Dec. 9, 2013, 53 pages, Advanced Micro Devices, Inc., Santa Clara, California.

Black, Bryan, et al., "3D Processing Technology and its Impact on iA32 Microprocessors," Proceedings of 2004 IEEE International Conference on Computer Design: VLSI in Computers and Processors, Oct. 11-13, 2004, 3 pages, IEEE, San Jose, California.

Black, Bryan, et al., "Die Stacking (3D) Microarchitecture," Proceedings of the 39th Annual IEEE/ACM International Symposium on Microarchitecture, Dec. 9-13, 2006, 11 pages, IEEE, Orlando, Florida.

Hajkazemi, Mohammad Hossein, et al., "Wide I/O or LPDDR? Exploration and Analysis of Performance, Power and Temperature Trade-offs of Emerging DRAM Technologies in Embedded MPSoCs," Proceedings of 33rd IEEE International Conference on Computer Design (ICCD), Oct. 18-21, 2015, 8 pages, IEEE, New York City, New York.

Invitation to Pay Additional Fees for Commonly Owned International Patent Application PCT/US2018/056559, dated Feb. 7, 2019, 15 pages, International Searching Authority (EPO).

Invitation to Pay Additional Fees for Commonly Owned International Patent Application PCT/US2018/056565, dated Feb. 12, 2019, 13 pages, International Searching Authority (EPO).

Kim, Jung-Sik, et al., "A 1.2 V 12.8 GB/s 2 Gb Mobile Wide-I/O DRAM With 4x128 I/Os Using TSV Based Stacking," IEEE Journal of Solid-State Circuits, Jan. 2012, 10 pages, vol. 47, No. 1, IEEE.

Loh, Gabriel H., et al., "Processor Design in 3D Die-Stacking Technologies," IEEE Micro, May/Jun. 2007, 18 pages, vol. 27, Issue 3, IEEE Computer Society.

Nakamoto, Mark, et al., "Simulation Methodology and Flow Integration for 3D IC Stress Management," 2010 IEEE Custom Integrated Circuits Conference, Sep. 19-22, 2010, 4 pages, IEEE, San Jose, CA, USA.

Tran, Kevin, et al., "Start Your HBM/2.5D Design Today," High-Bandwidth Memory White Paper, Mar. 29, 2016, 6 pages, Amkor Technology, Inc., San Jose, CA, USA.

Wu, Xiaoxia, et al., "Electrical Characterization for Intertier Connections and Timing Analysis for 3-D ICs," IEEE Transactions on Very Large Scale Integration (VLSI) Systems, Dec. 6, 2010, 5 pages, IEEE.

* cited by examiner

THREE DIMENSIONAL CHIP STRUCTURE IMPLEMENTING MACHINE TRAINED NETWORK

BACKGROUND

In recent years, there have been great advances in the field of machine learning. Much of these advances have been in machine trained networks (e.g., deep neural networks) and algorithms for training such networks. However, there has not been as much advances in circuits for implementing machine-trained networks. This has been primarily due to an over reliance on implementing machine trained networks in datacenters as opposed to in devices in the real world. Therefore, there is a need in the art for innovative circuits for implementing machine trained networks as well as other types of designs.

BRIEF SUMMARY

Some embodiments of the invention provide a three-dimensional (3D) circuit structure that uses latches to transfer signals between two bonded circuit layers. In some embodiments, this structure includes a first circuit partition on a first bonded layer and a second circuit partition on a second bonded layer. It also includes at least one latch to transfer signals between the first circuit partition on the first bonded layer and the second circuit partition on the second bonded layer. In some embodiments, the latch operates in (1) an open first mode that allows a signal to pass from the first circuit partition to the second circuit partition and (2) a closed second mode that maintains the signal passed through during the prior open first mode.

Unlike a flip-flop that releases in one clock cycle a signal that it stores in a prior clock cycle, a transparent latch does not introduce such a setup time delay in the design. In fact, by allowing the signal to pass through the first circuit partition to the second circuit partition during its open mode, the latch allows the signal to borrow time from a first portion of a clock cycle of the second circuit partition for a second portion of the clock cycle of the second circuit partition. This borrowing of time is referred to below as time borrowing. Also, this time borrowing allows the signal to be available at the destination node in the second circuit partition early so that the second circuit can act on it in the clock cycle that this signal is needed. Compared to flip-flops, latches also reduce the clock load because, while flip-flops require at least two different clock transitions to store and then release a value, transparent latches only require one signal transition to latch a value that they previously passed through.

In some embodiments, the 3D circuit has several such latches at several boundary nodes between different circuit partitions on different bonded layers. Each latch in some embodiments iteratively operates in two sequential modes, an open first mode to let a signal pass from one circuit partition (e.g., a first partition or a second partition) to the other circuit partition (e.g., the second partition or the first partition), and a closed second mode to hold the signal passed during the prior open first mode.

Each latch in some embodiments is associated with one pair of boundary nodes, with one node in the first bonded layer and another node in the second bonded layer. Each pair of nodes is electrically interconnected through a conductive interface, such as a through-silicon via (TSV) or a direct bond interface (DBI) connection (also called hybrid bonding). Each latch in some embodiments is defined on just one of the two bonded layers. In some embodiments, each latch on one bonded layer has its output carried to the other bonded layer by interconnect (e.g., wires) and the conductive interface (e.g., TSV or DBI connection) that connects the latch's associated pair of nodes. In other embodiments, each latch on one bonded layer has its input supplied from the other bonded layer by interconnect and the conductive interface that connects the latch's associated pair of nodes. In still other embodiments, a conductive-interface connection can have two latches on the two bonded layers that it connects, and either latch can be used to facilitate time borrowing as a signal travels between the two circuit partitions on the two bonded layers.

The first and second bonded layers are different in different embodiments. In some embodiments, both bonded layers are integrated circuit (IC) dies. In other embodiments, both bonded layers are IC wafers. In still other embodiments, one of these bonded layers is an IC die, while the other bonded layer is an IC wafer. The first and second bonded layers are vertically stacked on top of each other with no other intervening bonded layers in some embodiments, while these two bonded layers have one or more intervening bonded layers between them in other embodiments.

In some embodiments, one bonded layer fully overlaps the other bonded layer (e.g., the two bonded layers have the same size and are aligned such that they overlap each other's bounding shape), or one bonded layer is smaller than the other bonded layer and is completely subsumed by the footprint of the other bonded layer (i.e., has its bounding shape completely overlapped by the bounding shape of the other bonded layer). In other embodiments, the two bonded layers partially overlap. Also, in some embodiments, the first and second circuit partitions on the first and second bonded layers fully overlap (e.g., the two partition have the same size and are aligned such that they overlap each other's bounding shape), or one partition is smaller than the other partition and is completely subsumed by the footprint of the other partition). In other embodiments, the two circuit partitions partially overlap.

Some embodiments provide a three-dimensional (3D) circuit structure that has two or more vertically stacked bonded layers with a machine-trained network on at least one bonded layer. As described above, each bonded layer can be an IC die or an IC wafer in some embodiments with different embodiments encompassing different combinations of wafers and dies for the different bonded layers. The machine-trained network in some embodiments includes several stages of machine-trained processing nodes with routing fabric that supplies the outputs of earlier stage nodes to drive the inputs of later stage nodes. In some embodiments, the machine-trained network is a neural network and the processing nodes are neurons of the neural network.

In some embodiments, one or more parameters associated with each processing node (e.g., each neuron) is defined through machine-trained processes that define the values of these parameters in order to allow the machine-trained network (e.g., neural network) to perform particular operations (e.g., face recognition, voice recognition, etc.). For example, in some embodiments, the machine-trained parameters are weight values that are used to aggregate (e.g., to sum) several output values of several earlier stage processing nodes to produce an input value for a later stage processing node.

In some embodiments, the machine-trained network includes a first sub-network on one bonded layer and a second sub-network on another bonded layer, with these two sub-networks partially or fully overlapping. Alternatively, or conjunctively, the machine-trained network or sub-network on one bonded layer partially or fully overlaps a memory (e.g., formed by one or more memory arrays) on another bonded layer in some embodiments. This memory in some embodiments is a memory that stores machine-trained parameters for configuring the processing nodes of the machine-trained network or sub-network to perform a particular operation. In other embodiments, this memory is a memory that stores the outputs of the processing nodes (e.g., outputs of earlier stage processing node for later stage processing node).

While being vertically aligned with one memory, the machine-trained network's processing nodes in some embodiments are on the same bonded layer with another memory. For instance, in some embodiments, a first bonded layer in a 3D circuit includes the processing nodes of a machine-trained network and a first memory to store machine-trained parameters for configuring the processing nodes, while a second bonded layer in the 3D circuit includes a second memory to store values produced by the processing nodes. In other embodiments, the first bonded layer in the 3D circuit includes the processing nodes of a machine-trained network and a first memory to store values produced by the processing nodes, while the second bonded layer in the 3D circuit includes a second memory to store machine-trained parameters for configuring the processing nodes.

In still other embodiments, the first bonded layer in the 3D circuit includes the processing nodes of a machine-trained network, while the second bonded layer in the 3D circuit includes a first memory to store values produced by the processing nodes and a second memory to store machine-trained parameters for configuring the processing nodes. In yet other embodiments, the processing nodes on one bonded layer partially or fully overlap two memories on two different layers, with one memory storing machine-trained parameters and the other memory storing processing node output values. The 3D circuit of other embodiments has processing nodes on two or more bonded layers with parameter and/or output memories on the same or different bonded layers. In this document, parameter memory is a memory that stores machine-trained parameters for configuring the machine-trained network (e.g., for configuring the processing nodes of the network) to perform one or more tasks, while output memory is a memory that stores the outputs of the processing nodes of the machine-trained network.

Again, in the above-described embodiments, the bonded layers (two or more) that contain a machine-trained network's processing nodes and memories do not have any intervening bonded layer in some embodiments, while they have one or more intervening bonded layers between or among them in other embodiments. Also, in some embodiments, the machine-trained network's processing nodes and memories on different bonded layers are connected to each other through conductive interfaces, such as TSV or DBI connections.

In some embodiments, the IC die on which a neural network is defined is an ASIC (Application Specific IC) and each neuron in this network is a computational unit that is custom-defined to operate as a neuron. Some embodiments implement a neural network by re-purposing (i.e., reconfiguring) one or more neurons used for earlier neural network stages to implement one or more neurons in later neural network stages. This allows fewer custom-defined neurons to be used to implement the neural network. In such embodiments, the routing fabric between the neurons is at least partially defined by one or more output memories that are used to store the outputs of earlier used neurons to feed the inputs of later staged neurons.

In some embodiments, the output and parameter memories of the neural network have different memory structures (i.e., are different types of memories). For instance, in some embodiments, the output memory has a different type of output interface (e.g., one that allows for random access of the output memory's storage locations) than the parameter memory (e.g., the parameter memory's output interface only provides sequential access of its storage locations). Alternatively, or conjunctively, the parameter memory of the neural network is a read-only memory (ROM), while the output memory of the neural network is a read-write memory in some embodiments. The parameter memory in some embodiments is a sequential ROM that sequentially reads out locations in the ROM to output the parameters that configure the neural network to perform certain machine-trained task(s).

The output memory in some embodiments is a dynamic random access memory (DRAM). In other embodiments, the output memory is an ephemeral RAM (ERAM) that has one or more arrays of storage cells (e.g., capacitive cells) and pass transistors like traditional DRAMs, but does not use read-independent refresh cycles to charge the storage cells unlike traditional DRAMs. This is because the values in the ERAM memory are written and read at such rates that these values do not need to be refreshed with separate refresh cycles. In other words, because intermediate output values of the neural network only need to be used as input into the next layer (or few layers) of the neural network, they are temporary in nature. Thus, the output memory can be implemented with a memory architecture that is compact like a DRAM memory architecture without the need for read-independent refresh cycles.

Some embodiments of the invention provide an integrated circuit (IC) with a defect-tolerant neural network. The neural network has one or more redundant neurons in some embodiments. After the IC is manufactured, a defective neuron in the neural network can be detected through a test procedure and then replaced by a redundant neuron (i.e., the redundant neuron can be assigned the operation of the defective neuron). The routing fabric of the neural network can be reconfigured so that it re-routes signals around the discarded, defective neuron. In some embodiments, the reconfigured routing fabric does not provide any signal to or forward any signal from the discarded, defective neuron, and instead provides signals to and forwards signals from the redundant neuron that takes the defective neuron's position in the neural network.

In the embodiments that implement a neural network by re-purposing (i.e., reconfiguring) one or more individual neurons to implement neurons of multiple stages of the neural network, the IC discards a defective neuron by removing it from the pool of neurons that it configures to perform the operation(s) of neurons in one or more stages of neurons, and assigning this defective neuron's configuration(s) (i.e., its machine-trained parameter set(s)) to a redundant neuron. In some of these embodiments, the IC would re-route around the defective neuron and route to the redundant neuron, by (1) supplying machine-trained parameters and input signals (e.g., previous stage neuron outputs) to the redundant neuron instead of supplying these parameters and signals to the defective neuron, and (2) storing the output(s) of the redundant neuron instead of storing the output(s) of the defective neuron.

One of ordinary skill will understand that while several embodiments of the invention have been described above by reference to machine-trained neural networks with neurons, other embodiments of the invention are implemented on other machine-trained networks with other kinds of machine-trained processing nodes.

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description, the Drawings, and the Claims is needed. Moreover, the claimed subject matters are not to be limited by the illustrative details in the Summary, Detailed Description, and the Drawings.

BRIEF DESCRIPTION OF THE DRAWINGS

The novel features of the invention are set forth in the appended claims. However, for the purpose of explanation, several embodiments of the invention are set forth in the following figures.

DETAILED DESCRIPTION

Figure 1:
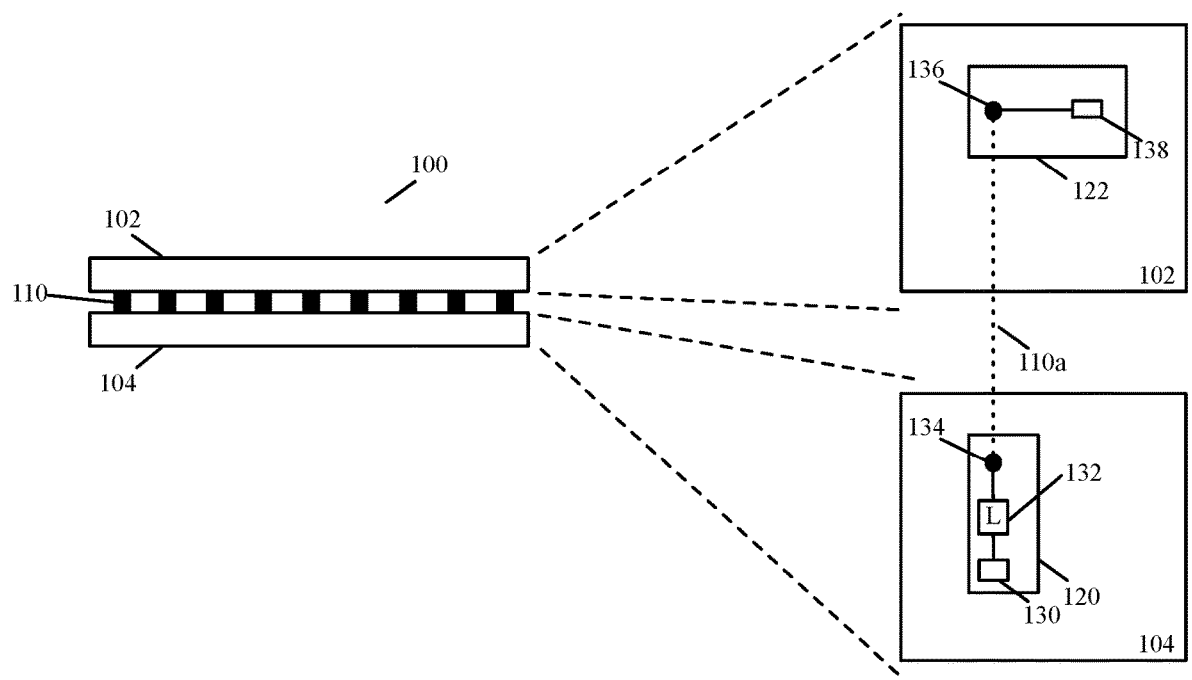
FIG. 1 illustrates an example of a three-dimensional (3D) circuit structure that has several latches at several boundary nodes between the two bonded layers.

In the following detailed description of the invention, numerous details, examples, and embodiments of the invention are set forth and described. However, it will be clear and apparent to one skilled in the art that the invention is not limited to the embodiments set forth and that the invention may be practiced without some of the specific details and examples discussed.

Some embodiments of the invention provide a three-dimensional (3D) circuit structure that uses latches to transfer signals between two bonded circuit layers. In some embodiments, this structure includes a first circuit partition on a first bonded layer and a second circuit partition on a second bonded layer. It also includes at least one latch to transfer signals between the first circuit partition on the first bonded layer and the second circuit partition on the second bonded layer. In some embodiments, the latch operates in (1) an open first mode (also called a transparent mode) that allows a signal to pass from the first circuit partition to the second circuit partition and (2) a closed second mode that maintains the signal passed through during the prior open first mode.

Unlike a flip-flop that releases in one clock cycle a signal that it stores in a prior clock cycle, a transparent latch does not introduce such a setup time delay in the design. In fact, by allowing the signal to pass through the first circuit partition to the second circuit partition during its open mode, the latch allows the signal to borrow time from a first portion of a clock cycle of the second circuit partition for a second portion of the clock cycle of the second circuit partition. This borrowing of time is referred to below as time borrowing. Also, this time borrowing allows the signal to be available at the destination node in the second circuit partition early so that the second circuit can act on it in the clock cycle that this signal is needed. Compared to flip-flops, latches also reduce the clock load because, while flip-flops require at least two different clock transitions to store and then release a value, transparent latches only require one signal transition to latch a value that they previously passed through.

The first and second bonded layers are different in different embodiments. In some embodiments, both bonded layers are integrated circuit (IC) dies. In other embodiments, both bonded layers are IC wafers. In still other embodiments, one of these bonded layers is an IC die, while the other bonded layer is an IC wafer. The first and second bonded layers are vertically stacked on top of each other with no other intervening bonded layers in some embodiments, while these two bonded layers have one or more intervening bonded layers between them in other embodiments.

In some embodiments, the 3D circuit has several such latches at several boundary nodes between different circuit partitions on different bonded layers. Each latch in some embodiments is associated with one pair of boundary nodes, with one node in the first bonded layer and another node in the second bonded layer. Each pair of nodes is electrically interconnected through a conductive interface, such as a through-silicon via (TSV) or a direct bond interface (DBI) connection. Each latch in some embodiments is defined on just one of the two bonded layers.

FIG. 1 illustrates an example of a 3D circuit structure that has several latches at several boundary nodes between the two bonded layers. This structure is a 3D IC 100 that is formed by vertically stacking two IC dies 102 and 104. In this example, the two dies 102 and 104 have the same size and are aligned so that their bounding shapes overlap each other. This does not have to be the case, as in some embodiments, the different dies have different sizes and are vertically aligned differently.

In FIG. 1, the 3D circuit structure 100 has several conductive vertical connections 110 that connect circuits on the two IC dies 102 and 104. Examples of such connections include TSVs and DBI connections. DBI provides area-efficient, dense interconnect between two blocks. In two dimensions, the number of interconnects between two blocks is limited to the perimeter facing each other. Fine pitch 3D interface, on the other hand, is only limited by the area of the block overlap. For example, a 1×1 mm block with 100 nm wire pitch and 2 um DBI pitch can fit 10,000 wires through one side in a 2D format versus 250,000 wires spread across the entire block through DBI in a 3D format. DBI is further described in U.S. Pat. Nos. 6,962,835 and 7,485,968, both of which are incorporated herein by reference.

For each of several conductive vertical connections between two adjacent dies, one or both of the dies has a latch that electrically connects (through interconnect) to the conductive-interface connection. In some embodiments, each such latch iteratively operates in two sequential modes, an open first mode (also called a transparent mode) to let a signal pass from one circuit partition on one IC die to a circuit partition on the other IC die, and a closed second mode to hold the signal passed during the prior open first mode.

FIG. 1 illustrates one such latch 132. This latch facilitates signal flow between a first node 130 in a first circuit block 120 on the IC die 104 to a second node 138 in a second circuit block 122 on the IC die 102. This signal flow traverses along a conductive vertical connection 110a (e.g., one DBI connection) between the IC dies 102 and 104. As shown, this conductive vertical connection 110a connects two nodes on the two dies, a node 134 on die 104 and a node 136 on die 102. In this example, the latch 132 on the IC dies 104 has its output carried to the IC die 102 by interconnect (e.g., wires) and the conductive vertical connection 110a.

Figure 2:
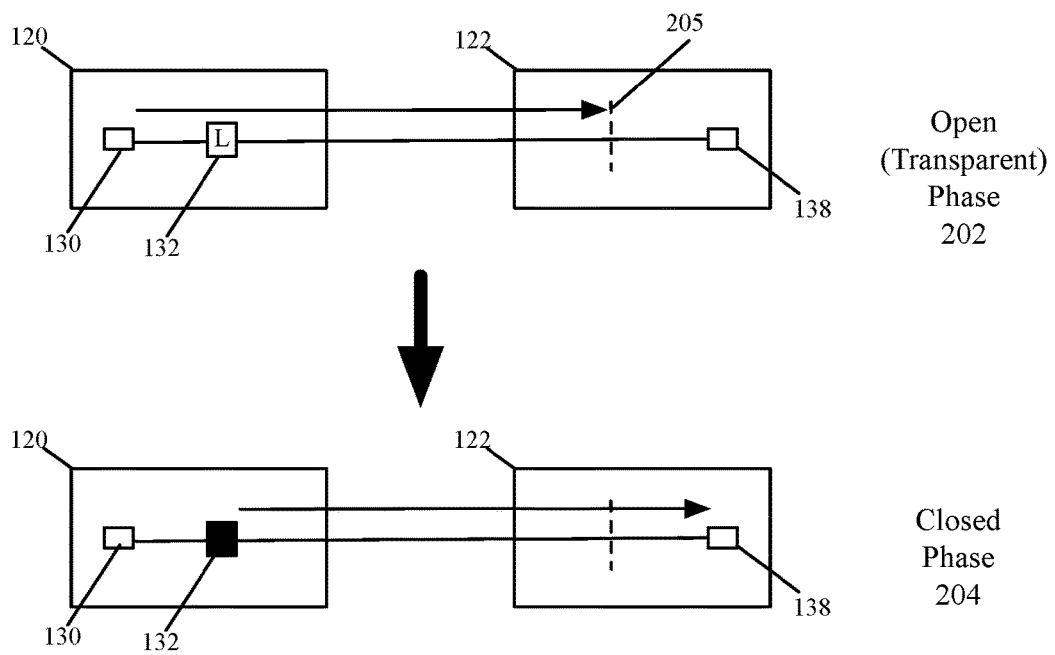
FIG. 2 illustrates how the latch of FIG. 1 allows the signal traversing the two dies to time borrow.

FIG. 2 illustrates how the latch 132 allows the signal traversing the two dies 102 and 104 to time borrow. Specifically, it shows the latch 132 operating in an open first phase 202. During this phase, the latch is open and transparent. Thus, it allows a signal to pass from the first circuit partition 120 to location 205 in the second circuit partition 122. FIG. 2 also shows the latch 132 operating in a closed second phase 204. During this phase, the latch has closed. When the latch closes, it maintains the signal that passed through it during the prior open first phase. As shown, the signal reaches the node 138 during the second phase.

Because the latch was open during its first phase, the signal was allowed to pass through from the first circuit block 120 to the second circuit block in this phase, which, in turn, allowed the signal to reach its destination 138 in the second circuit block 120 sooner in the closed second phase 204 of the latch 132. In this manner, the latch allows the signal to time borrow (e.g., borrow time from the first phase to speed up the operation of the second circuit block during the second phase).

Figure 3:
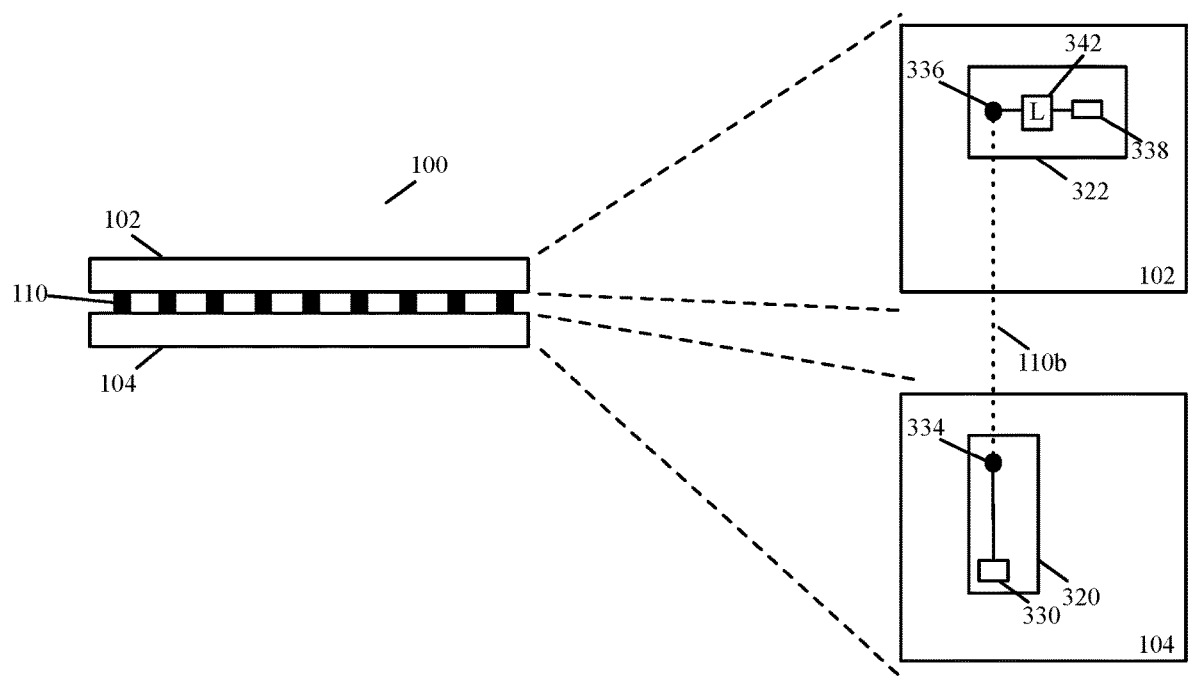
FIG. 3 illustrates another example of a 3D circuit structure with a latch being placed on the IC die layer on which a signal terminates.
Figure 4:
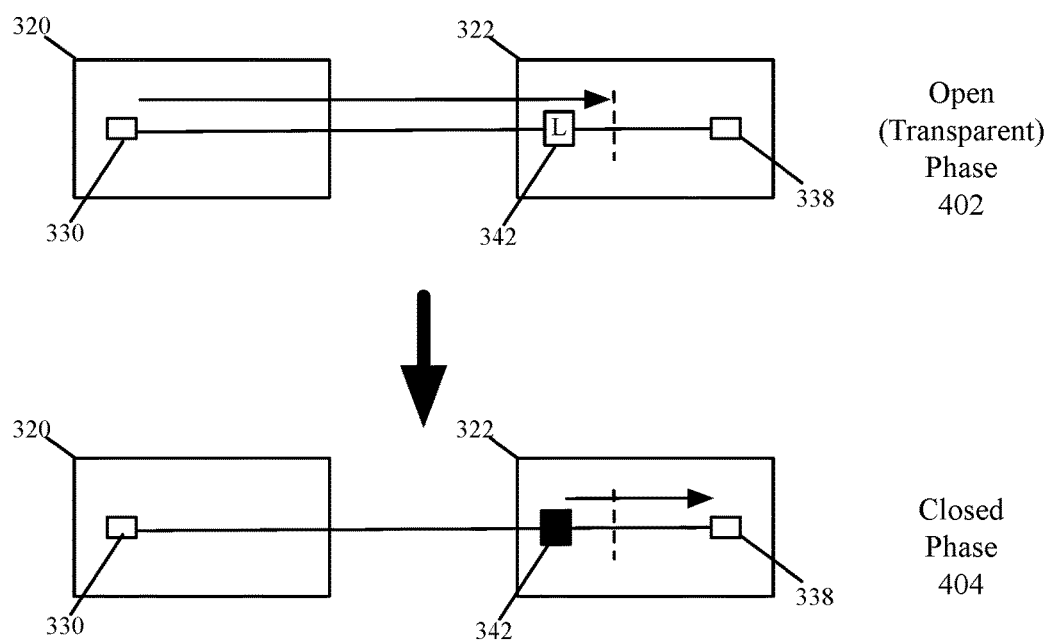
FIG. 4 illustrates how the latch of FIG. 3 allows the signal traversing the two dies to time borrow.

Instead of placing a latch on the IC die layer from which the signal originates, some embodiments place the latch on the IC die layer on which the signal terminates. FIGS. 3 and 4 illustrate one such example. The example in this figure is similar to the example in FIGS. 1 and 2, except that the latch 132 on the IC die 104 has been replaced with a latch 342 on the IC die 102. This latch is used when a signal traverses from a node 330 on a circuit block 320 on the first die 104 along a vertical connection 110b to node 338 on a circuit block 322 on the second die 102. The vertical connection 110b connects two nodes 334 and 336 on the two dies 105 and 102.

As shown in FIG. 4, the latch 342 operates in an open first phase 402. During this phase, the signal from a node 330 passes from the first circuit partition 320 to location 405 in the second circuit partition 322. When the latch 342 closes (i.e., operates in the closed second phase 404), the latch maintains the signal that passed through it during the prior open first phase to allow the signal to reach the node 338 during the second phase.

In other embodiments, a conductive vertical connection can be associated with two latches on the two bonded layers that it connects, and either latch can be used to facilitate time borrowing as a signal travels between the two circuit partitions on the two bonded layers through the conductive vertical connection. Thus, for the examples illustrated in FIGS. 1-4, the 3D IC has both latches 132 and 142 respectively in circuit partitions 120 and 122, and either of these latches can be selectively enabled to facilitate time borrowing across the two layers.

Figure 5:
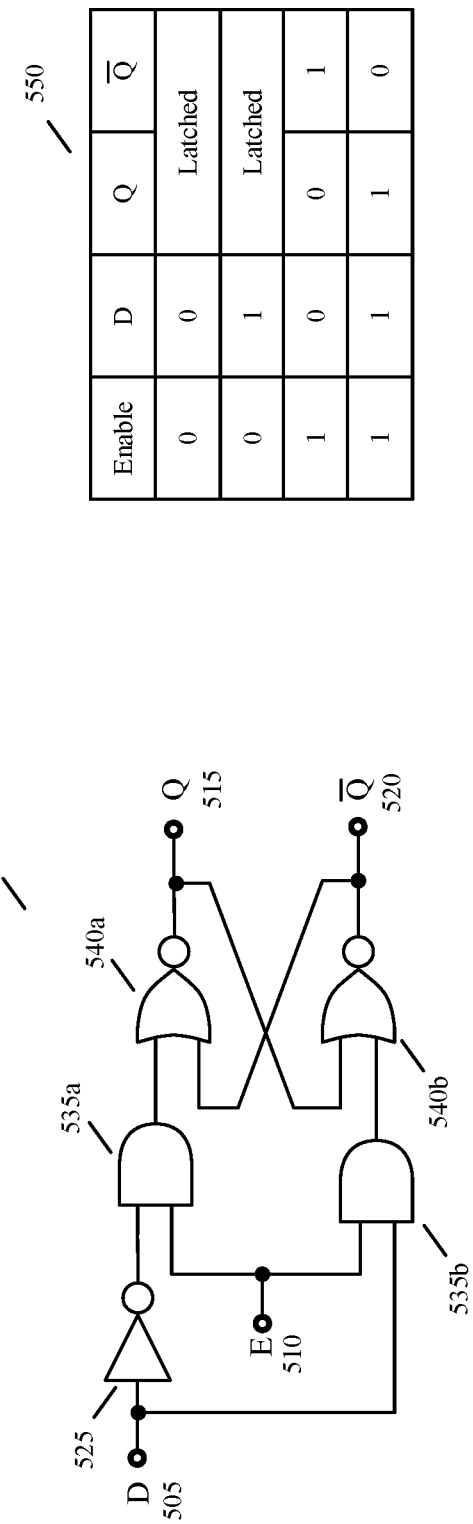
FIG. 5 illustrates an example of a transparent latch.

FIG. 5 illustrates an example of a transparent latch 500. This latch is a D-latch that is formed by an inverter 525, two AND gates 535a and 535b, and two XOR gates 540a and 540b. The inverter receives the input signal at its D terminal 505 and provides its output to an input of AND gate 535a. The input signal is also fed to one of the inputs of the AND gate 535b. The AND gates 535a and 535b also get a latch enable signal E at the latch's enable terminal 510. This enable signal can be a signal generated by another user-design circuit or a signal supplied by a clock or by a storage location driven by the clock or a user-design circuit.

The outputs of the AND gates 535a and 535b are supplied respectively to XOR gates 540a and 540b. These XOR gates are cross-coupled such that their outputs are fed back to the inputs of each other. The outputs of the XOR gates 540a and 540b represent the output of the latch. When only one latch output is needed, the output of XOR gate 540a presented at the Q terminal 515 of the latch serves as the output of the latch 500. As shown by the truth table 550 in FIG. 5, the latch operates in its open/transparent mode (to pass through a signal) when the enable signal is 1, while it operates in a close/latch mode (to maintain the signal previously passed) when the enable signal is 0.

Some embodiments provide a three-dimensional (3D) circuit structure that has two or more vertically stacked bonded layers with a machine-trained network on at least one bonded layer. For instance, each bonded layer can be an IC die or an IC wafer in some embodiments with different embodiments encompassing different combination of wafers and dies for the different bonded layers. Also, the machine-trained network includes an arrangement of processing nodes in some embodiments. In several examples described below, the processing nodes are neurons and the machine-trained network is a neural network. However, one of ordinary skill will realize that other embodiments are implemented with other machine-trained networks that have other kinds of machine-trained processing nodes.

Figure 6:
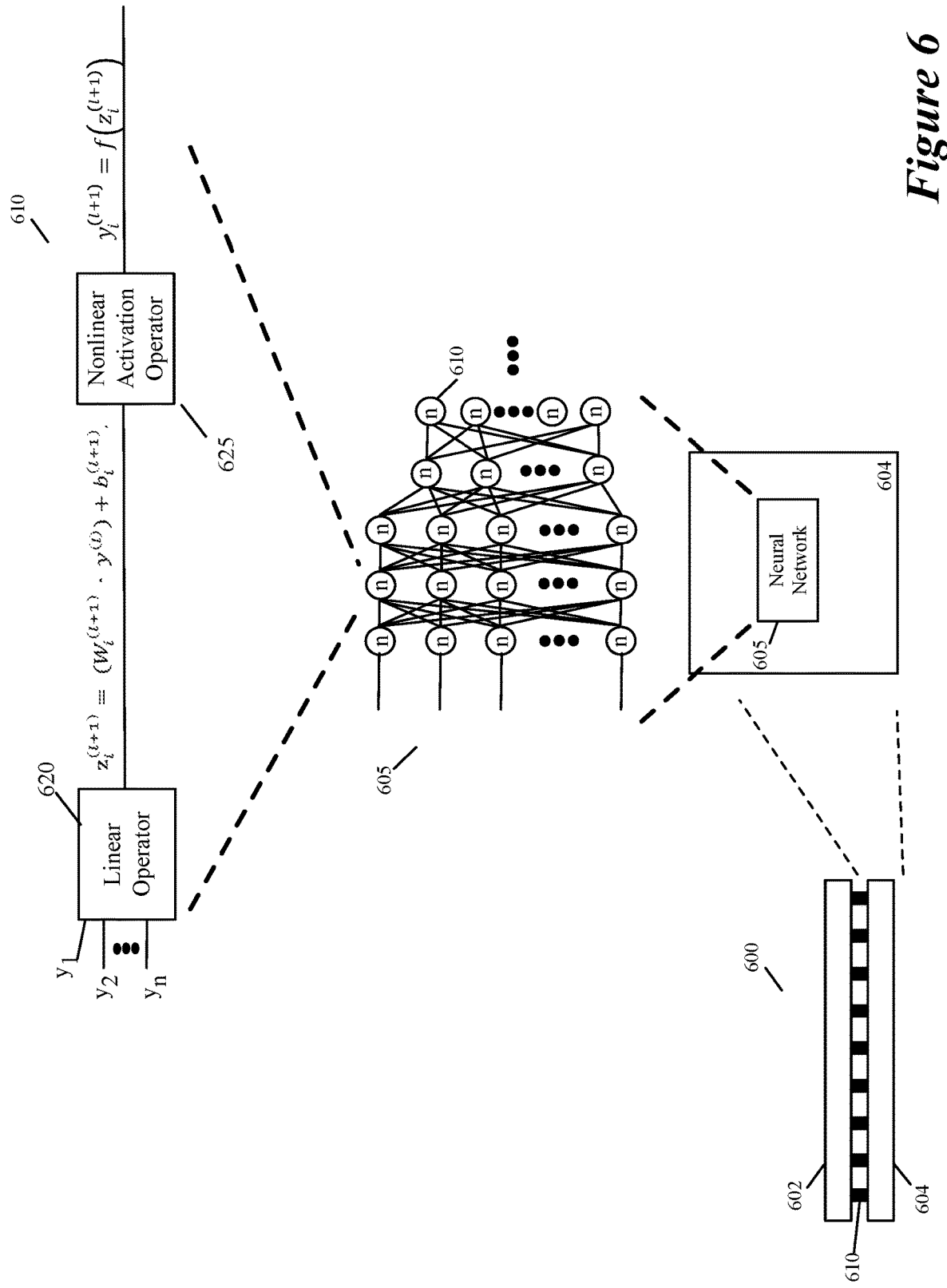
FIG. 6 illustrates a 3D circuit structure that has two or more vertically stacked bonded layers with a neural network on at least one bonded layer.

FIG. 6 illustrates an example of a 3D circuit structure with a neural network on at least one of its bonded layers. In this example, the 3D circuit structure is a 3D IC 600 that has two vertically stacked dies 602 and 604, with IC die 604 having a neural network 605. In this example, the IC dies 602 and 604 have the same size and are aligned so that their bounding shapes overlap. This does not have to be the case, as in some embodiments, the different dies have different sizes and are vertically aligned differently. As shown in FIG. 6, the IC dies 602 and 604 have several vertical connections, which in some embodiments are DBI connections. In other embodiments, these connections are other types of direct bonding connections or TSV connections.

As further shown, the neural network 605 in some embodiments includes several stages of neurons 610 with routing fabric that supplies the outputs of earlier stage neurons to drive the inputs of later stage neurons. In some embodiments, one or more parameters associated with each neuron is defined through machine-trained processes that define the values of these parameters in order to allow the neural network to perform particular operations (e.g., face recognition, voice recognition, etc.).

FIG. 6 illustrates an example of such machine-trained parameters for some embodiments. These parameters are the weight values $W_i$ that are used to sum several output values $y_i$ of several earlier stage neurons to produce an input value $z_i$ for an activation function 625 of a later stage neuron. In this example, the neural network is a feed-forward neural network that has multiple neurons arranged in multiple layers (multiple stages), with each neuron having a linear component 620 and a non-linear component 625, called an activation function. In other embodiments, the neural network is not a feed forward network (e.g., is a recurrent network, etc.).

In all but the last layer of the feed-forward neural network 605, each neuron 610 receives two or more outputs of neurons from earlier neuron layers (earlier neuron stages) and provides its output to one or more neurons in subsequent neuron layers (subsequent neuron stages). The outputs of the neurons in the last layer represent the output of the network 605. In some embodiments, each output dimension of the network 600 is rounded to a quantized value.

The linear component (linear operator) 620 of each interior or output neuron computes a dot product of a vector of weight coefficients and a vector of output values of prior nodes, plus an offset. In other words, an interior or output neuron's linear operator computes a weighted sum of its inputs (which are outputs of the previous stage neurons that the linear operator receives) plus an offset. Similarly, the linear component 620 of each input stage neuron computes a dot product of a vector of weight coefficients and a vector of input values, plus an offset. Each neuron's nonlinear component (nonlinear activation operator) 625 computes a function based on the output of the neuron's linear component 620. This function is commonly referred to as the activation function.

The notation of FIG. 6 can be described as follows. Consider a neural network with L hidden layers (i.e., L layers that are not the input layer or the output layer). Hidden layers are also referred to as intermediate layers. The variable l can be any of the L hidden layers (i.e., $l \in \{1, \ldots, L\}$ index the hidden layers of the network). The variable $z_i^{(l+1)}$ represents the output of the linear component of an interior neuron i in layer l+1. As indicated by the following Equation (A), the variable $z^{(l+1)}$ in some embodiments is computed as the dot product of a vector of weight values $W^{(l)}$ and a vector of outputs $y^{(l)}$ from layer l plus an offset $b_i$, typically referred to as a bias.

$$z_i^{(l+1)}=(W_i^{(l+1)} \cdot y^{(l)})+b_i^{(l+1)}. \quad (A)$$

The symbol · is the dot product. The weight coefficients $W^{(l)}$ are weight values that can be adjusted during the network's training in order to configure this network to solve a particular problem. Other embodiments use other formulations than Equation (A) to compute the output $z_i^{(l+1)}$ of the linear operator 620.

The output $y^{(l+1)}$ of the nonlinear component 625 of a neuron in layer l+1 is a function of the neuron's linear component, and can be expressed as by Equation (B) below.

$$y_i^{(l+1)}=f(z_i^{(l+1)}), \quad (B)$$

In this equation, $f$ is the nonlinear activation function for node i. Examples of such activation functions include a sigmoid function ($f(x)=1/(1+e^{-x})$), a tan h function, a ReLU (rectified linear unit) function or a leaky ReLU function.

Traditionally, the sigmoid function and the tan h function have been the activation functions of choice. More recently, the ReLU function has been proposed for the activation function in order to make it easier to compute the activation function. See Nair, Vinod and Hinton, Geoffrey E., "Rectified linear units improve restricted Boltzmann machines," ICML, pp. 807-814, 2010. Even more recently, the leaky ReLU has been proposed in order to simplify the training of the processing nodes by replacing the flat section of the ReLU function with a section that has a slight slope. See He, Kaiming, Zhang, Xiangyu, Ren, Shaoqing, and Sun, Jian, "Delving deep into rectifiers: Surpassing human-level performance on imagenet classification," arXiv preprint arXiv: 1502.01852, 2015. In some embodiments, the activation functions can be other types of functions, like cup functions and periodic functions.

Before the neural network 605 can be used to solve a particular problem (e.g., to perform face recognition), the network in some embodiments is put through a supervised training process that adjusts (i.e., trains) the network's configurable parameters (e.g., the weight coefficients of its linear components). The training process iteratively selects different input value sets with known output value sets. For each selected input value set, the training process in some embodiments forward propagates the input value set through the network's nodes to produce a computed output value set. For a batch of input value sets with known output value sets, the training process back propagates an error value that expresses the error (e.g., the difference) between the output value sets that the network 605 produces for the input value sets in the training batch and the known output value sets of these input value sets. This process of adjusting the configurable parameters of the machine-trained network 605 is referred to as supervised, machine training (or machine learning) of the neurons of the network 605.

In some embodiments, the IC die on which the neural network is defined is an ASIC (Application Specific IC) and each neuron in this network is a computational unit that is custom-defined to operate as a neuron. Some embodiments implement a neural network by re-purposing (i.e., reconfiguring) one or more neurons used for earlier neural network stages to implement one or more neurons in later neural network stages. This allows fewer custom-defined neurons to be needed to implement the neural network. In such embodiments, the routing fabric between the neurons is at least partially defined by one or more output memories that are used to store the outputs of earlier stage neurons to feed the inputs of later stage neurons.

Figure 7:
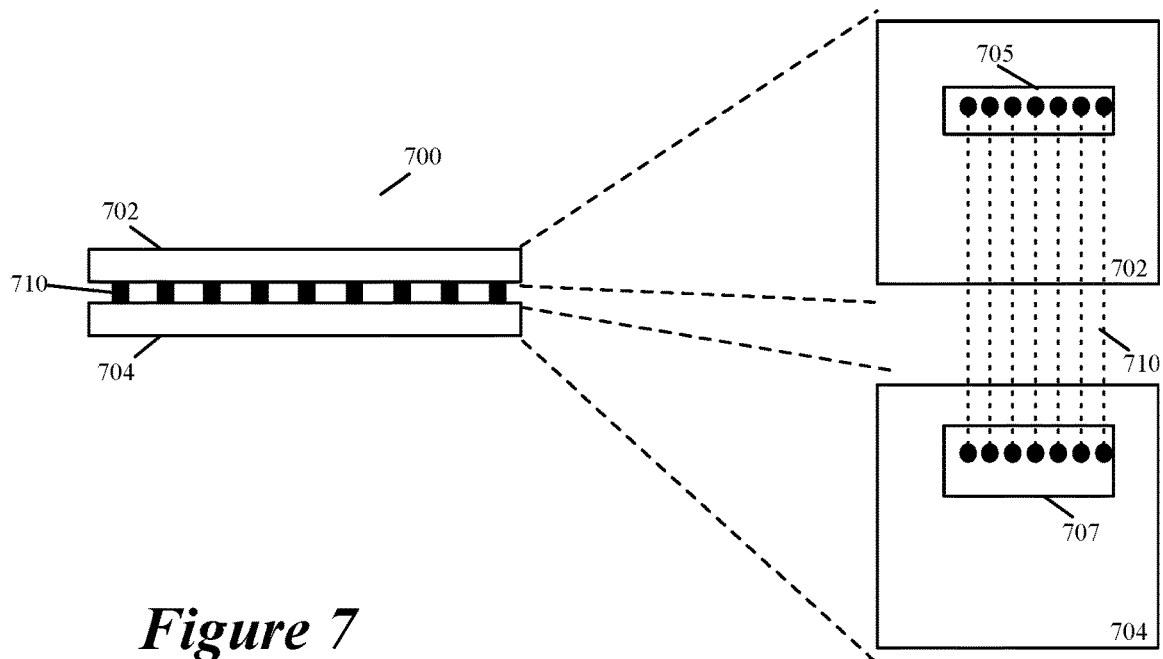
FIG. 7 illustrates an example of a neural network that includes a first sub-network on one bonded layer and a second sub-network on another bonded layer.

In some embodiments, the neural network includes a first sub-network on one bonded layer and a second sub-network on another bonded layer, with these two sub-networks partially or fully overlapping. FIG. 7 illustrates an example of such an embodiment. It shows a 3D IC 700 with a neural network that is formed by two sub-networks 705 and 707. As shown, the first sub-network 705 is on a first IC die 702 while the second sub-network 707 is on a second IC die 704. The footprints of these two sub-networks 705 and 707 on the two different IC dies 702 and 704 partially or fully overlap.

As further shown in FIG. 7, the components on the IC's dies 702 and 704 are interconnected by several vertical connections 710, which in some embodiments are DBI connections. In other embodiments, these connections are other types of direct bonding connections or TSV connections. As shown, numerous such connections 710 are used to electrically connect nodes on the two sub-networks 705 and 707 on the dies 702 and 704.

In some embodiments, the sub-network 705 are the neurons that are used to implement the odd layer neurons in the multi-layer neuron arrangement (e.g., the multi-layer arrangement shown in FIG. 6), while the sub-network 707 are the neurons that are used to implement the even layer neurons in this arrangement. In other embodiments, each sub-network has multiple layers (stages) of neurons (e.g., two layers of neurons) for implementing multiple adjacent layers of neurons (e.g., sub-network 705 implements even adjacent pairs of neuron layers, while sub-network 707 implements odd adjacent pairs of neuron layers, where even and odd layer pairs sequentially alternate and the first layer pair are the first two neuron layers).

In some embodiments, the vertical connections 710 connect the output of neurons of sub-network 705 on the first IC die to an output memory on the second die that connects to the sub-network 707, so that these values can be stored in the output memory. From this memory, the stored output values are supplied to neurons of the sub-network 707 on the second die so that these neurons can perform computations based on the outputs of the neurons of the sub-network 705 that implement an earlier stage of the neural network's operation.

In some of these embodiments, the outputs of the neurons of the sub-network 707 are then passed through the vertical connections 710 to an output memory on the first die 702 that connects to the sub-network 705. From the output memory on the first die 702, the outputs of the neurons of the sub-network 707 of the second die are supplied to the neurons of the sub-network 705 of the first die once these neurons have been configured to perform the operation of later stage neurons of the neural network. Based on these outputs, the neurons of the sub-network 705 can then perform computations associated with the later stage neurons of the neural network. In this manner, the output values of the neurons of the sub-networks 705 and 707 can continue to pass back and forth between the two IC dies 702 and 704 as the neurons of each sub-network 705 and 707 are reconfigured to perform successive or successive sets (e.g., pairs) of stages of operation of the neural network.

Alternatively, or conjunctively, the neural network or sub-network on one bonded layer partially or fully overlaps a memory (e.g., formed by one or more memory arrays) on another bonded layer in some embodiments. This memory in some embodiments is a parameter memory that stores machine-trained parameters for configuring the neurons of the neural network or sub-network to perform a particular operation. In other embodiments, this memory is an output memory that stores the outputs of the neurons (e.g., outputs of earlier stage neurons for later stage neurons).

Figure 8:
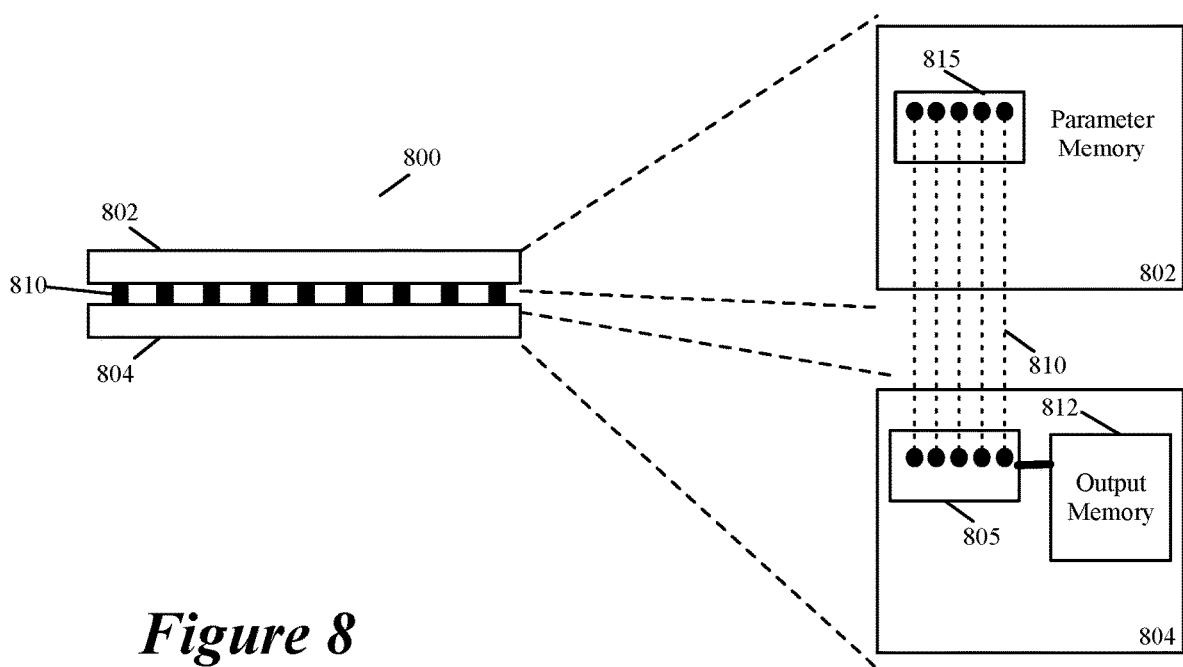
FIG. 8 illustrates an example of a neural network that has its neurons aligned with one memory while being on the same bonded layer with another memory.

While being vertically aligned with one memory, the neural network's neurons in some embodiments are on the same bonded layer with another memory. FIG. 8 illustrates one such example. It illustrates a 3D IC 800 with two IC dies 802 and 804 that have several components of the neural network. These components are several neurons 805 and an output memory 812 on the IC die 804, and a parameter memory 815 on the IC die 802. The output memory 812 stores values produced by the neurons 805, while the parameter memory 815 stores machine-trained parameters for configuring the neurons. As shown, the footprints of arrangement of neurons 805 and the parameter memory 815 fully overlap in some embodiments. These footprints partially overlap in other embodiments, or do not overlap in yet other embodiments.

As further shown in FIG. 8, the components on the IC's dies 802 and 804 are interconnected by several vertical connections 810, which in some embodiments are DBI connections. In other embodiments, these connections are other types of direct bonding connections or TSV connections. As shown, numerous such connections 810 are used to electrically connect nodes of the neurons 805 on the IC die 804 to nodes of the parameter memory 815 on the IC die 802. Through these connections, the neurons receive the machine-trained parameters that configure the neural network to perform a set of operations (e.g., a set of one or more tasks, such as face recognition) for which the neural network has been trained.

The neurons 805 connect to the output memory 812 through one or more interconnect layers (also called metal layers or wiring layers) of the IC die 804. As known in the art, each IC die is manufactured with multiple interconnect layers that interconnect the circuit components (e.g., transistors) defined on the IC die's substrate. Through its connection with the output memory, the outputs of the neurons are stored so that these outputs can later be retrieved as inputs for later stage neurons or for the output of the neural network.

Figure 9:
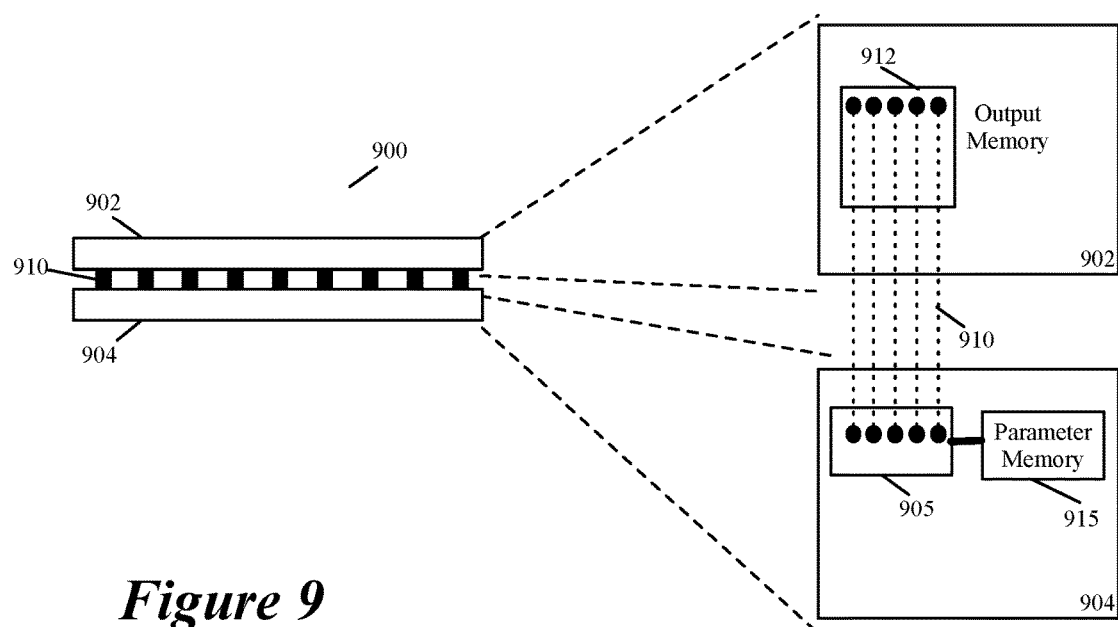
FIGS. 9 and 10 illustrate different examples of a 3D IC with different components of a neural network on different IC dies.

FIG. 9 illustrates another example of a 3D IC with different components of a neural network on different IC dies. This figure illustrates a 3D IC 900 with two IC dies 902 and 904 that have several components of the neural network. These components are several neurons 905 and a parameter memory 915 on the IC die 904, and an output memory 912 on the IC die 902. As shown, the footprints of arrangement of neurons 905 and the output memory 912 partially overlap in some embodiments. In other embodiments, these footprints fully overlap, while in yet other embodiments, they do not overlap.

As further shown in FIG. 9, the components on the IC's dies 902 and 904 are interconnected by several vertical connections 910, which in some embodiments are DBI connections. In other embodiments, these connections are other types of direct bonding connections or TSV connections. As shown, numerous such connections 910 are used to electrically connect nodes of the neurons 905 on the IC die 904 to nodes of the output memory 912 on the IC die 902. Through these connections, the outputs of the neurons are stored so that these outputs can later be retrieved as inputs for later stage neurons or for the output of the neural network. As described above, the 3D IC of some embodiments has output memories and neurons on each of two face-to-face mounted dies (like dies 902 and 904) with the output memory on each die receiving outputs from neurons on another die and providing its content to neurons on its own die.

The neurons 905 connect to the parameter memory 915 through one or more interconnect layers of the IC die 904. Through its connection with the parameter memory, the neurons receive the machine-trained parameters (e.g., weight values for the linear operators of the neurons) that configure the neural network to perform a set of one or more tasks (e.g., face recognition) for which the neural network has been trained. When neurons are placed on both face-to-face mounted dies, some embodiments also place parameter memories on both dies in order to provide machine-trained parameters to neurons on the same IC die or to neurons on the other IC die.

Figure 10:
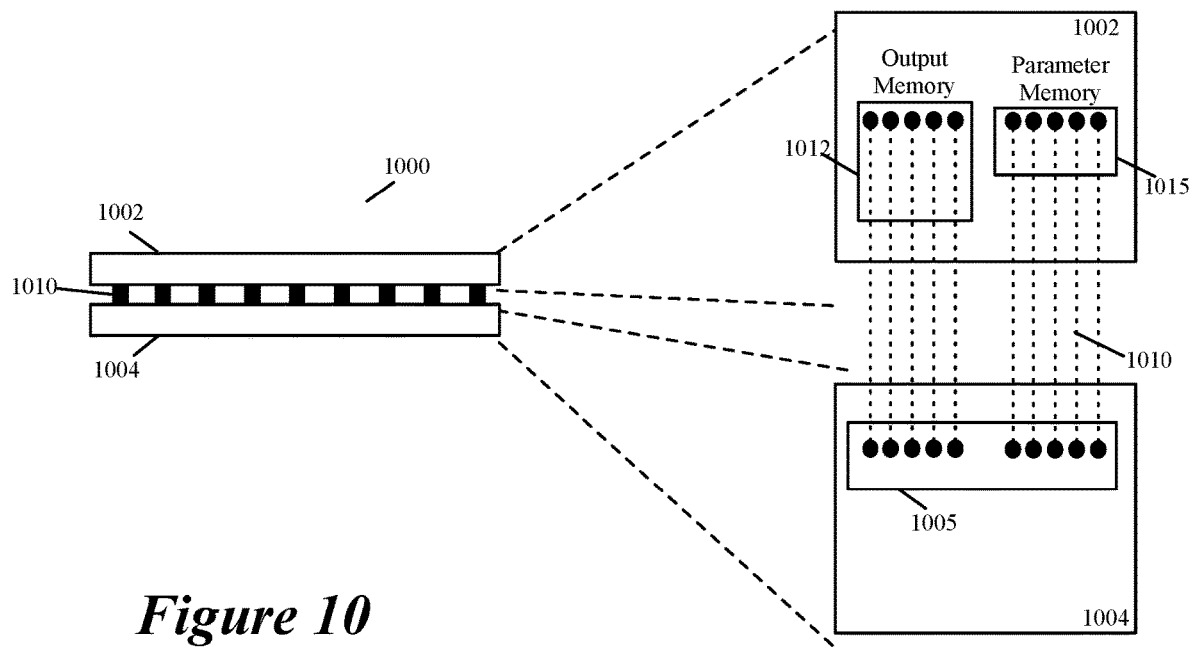

FIG. 10 illustrates another example of a 3D IC with different components of a neural network on different IC dies. This figure illustrates a 3D IC 1000 with two IC dies 1002 and 1004 that have several components of the neural network. These components are several neurons 1005 on the IC die 1004, and an output memory 1012 and a parameter memory 1015 on the IC die 1002. As shown, the footprint of arrangement of neurons 1005 partially overlaps the output memory 1012 and the parameter memory 1015.

As further shown in FIG. 10, the components on the IC's dies 1002 and 1004 are interconnected by several vertical connections 1010, which in some embodiments are DBI connections. In other embodiments, these connections are other types of direct bonding connections or TSV connections. As shown, numerous such connections 1010 are used to electrically connect nodes of the neurons 1005 on the IC die 1004 to either nodes of the output memory 1012 on the IC die 1002, or to nodes of the parameter memory 1015 on the IC die 1002. Through the connections 1010 with the output memory 1012, the outputs of the neurons are stored so that these outputs can later be retrieved as inputs for later stage neurons or for the output of the neural network. Also, through the connections 1010 with the parameter memory 1015, the neurons receive the machine-trained parameters (e.g., weight values for the linear operators of the neurons) that configure the neural network to perform a set of one or more tasks (e.g., face recognition) for which the neural network has been trained.

Figure 11:
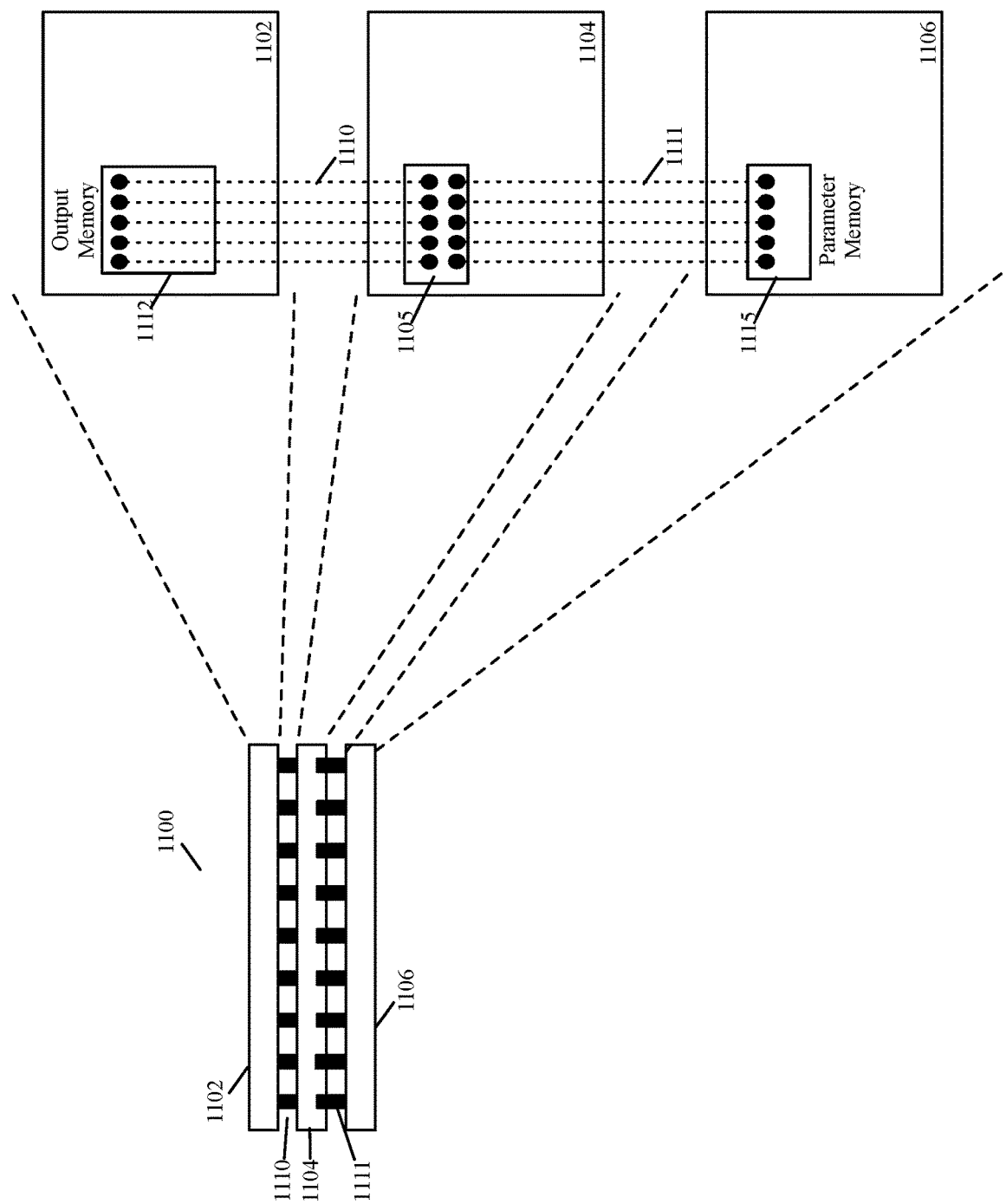
FIG. 11 illustrates an example of a 3D IC with the neuron on one bonded layer partially or fully overlapping two memories on two different layers.

In some embodiments, the neurons on one bonded layer partially or fully overlap two memories on two different layers, with one memory storing machine-trained parameters and the other memory storing neuron output values. FIG. 11 illustrates one such example. This figure illustrates a 3D IC 1100 with multiple IC dies 1102, 1104, and 1106, each of which has a component of the neural network. These components are several neurons 1105 on the IC die 1104, an output memory 1112 on the IC die 1102, and a parameter memory 1115 on the IC die 1106. As shown, the footprints of the arrangement of neurons 1105 on the IC die 1104 and the output memory 1112 on the IC die 1102 partially or fully overlap. The footprint of the arrangement of neurons 1105 on the IC die 1104 also partially or fully overlaps with the footprint of the parameter memory 1115 on the IC die 1106.

As further shown in FIG. 11, the components on the IC's dies 1102, 1104, and 1106 are interconnected by several vertical connections 1110 and 1111. In this example, IC dies 1102 and 1104 are face-to-face mounted, while the IC dies 1106 and 1104 are face-to-back mounted with the face of the IC die 1106 mounted with the back of the IC die 1104. In some embodiments, the vertical connections 1110 between the dies 1102 and 1104 are direct bonded connections (like DBI connections), while the vertical connections 1111 between dies 1104 and 1106 are TSVs.

As shown, numerous such connections 1110 and 1111 are used to electrically connect nodes of the neurons 1105 on the IC die 1104 to either nodes of the output memory 1112 on the IC die 1102, or to nodes of the parameter memory 1115 on the IC die 1106. Through the connections 1110 with the output memory 1112, the outputs of the neurons are stored so that these outputs can later be retrieved as inputs for later stage neurons or for the output of the neural network. Also, through the connections 1111 with the parameter memory 1115, the neurons receive the machine-trained parameters that configure the neural network to perform a set of one or more tasks (e.g., face recognition) for which the neural network has been trained.

One of ordinary skill will realize that other permutations of 3D circuit structures are also possible. For instance, in some embodiments, the 3D circuit has neurons on two or more bonded layers with parameter and/or output memories on the same or different bonded layers. Also, in the above-described embodiments, the bonded layers (two or more) that contain a neural network's neurons and memories do not have any intervening bonded layer in some embodiments. In other embodiments, however, these bonded layers have one or more intervening bonded layers between or among them.

In some embodiments, the output and parameter memories of the neural network have different memory structures (i.e., are different types of memories). For instance, in some embodiments, the output memory (e.g., memory 812, 912, 1012, or 1112) has a different type of output interface than the parameter memory (e.g., the memory 815, 915, 1015, or 1115). For example, the output memory's output interface allows for random access of this memory's storage locations, while the parameter memory's output interface only supports sequential read access.

Alternatively, or conjunctively, the parameter memory (e.g., the memory 815, 915, 1015, or 1115) of the neural network is a read-only memory (ROM), while the output memory (e.g., memory 812, 912, 1012, or 1112) of the neural network is a read-write memory in some embodiments. The parameter memory in some embodiments is a sequential ROM that sequentially reads out locations in the ROM to output the parameters that configure the neural network to perform certain machine-trained task(s).

The output memory (e.g., memory 812, 912, 1012, or 1112) in some embodiments is a dynamic random access memory (DRAM). In other embodiments, the output memory is an ephemeral RAM (ERAM) that has one or more arrays of storage cells (e.g., capacitive cells) and pass transistors like traditional DRAMs. However, unlike traditional DRAMs, the ERAM output memory does not use read-independent refresh cycles to charge the storage cells. This is because the values in the ERAM output memory are written and read at such rates that these values do not need to be refreshed with separate refresh cycles. In other words, because intermediate output values of the neural network only need to be used as input into the next layer (or few layers) of the neural network, they are temporary in nature. Thus, the output memory can be implemented with a compact, DRAM-like memory architecture without the use of the read-independent refresh cycles of traditional DRAMs.

Using different dies for the output memory 1112 and parameter memory 1115 allows these dies to be manufactured by processes that are optimal for these types of memories. Similarly, using a different die for the neurons of the neural network than for the output memory and/or parameter memory also allows each of these components to be manufactured by processes that are optimal for each of these types of components.

Figure 12:
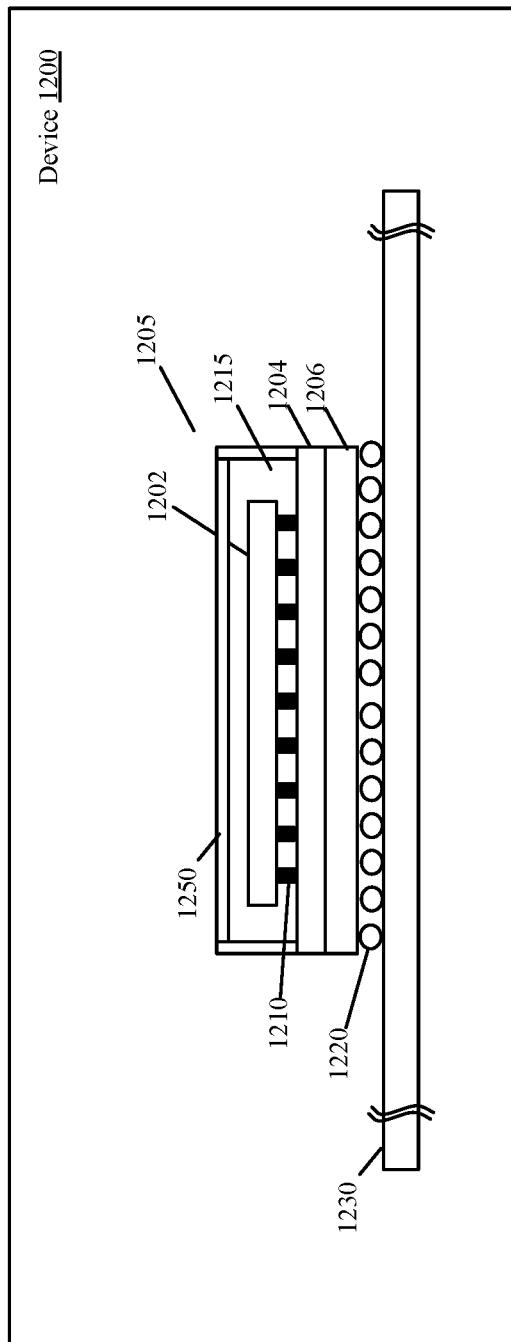
FIG. 12 illustrates a device that uses a 3D IC of some embodiments.

FIG. 12 illustrates a device 1200 that uses a 3D IC 1205, such as 3D IC 100, 600, 700, 800, 900, or 1000. In this example, the 3D IC 1205 is formed by two face-to-face mounted IC dies 1202 and 1204 that have numerous direct bonded connections 1210 between them. In other examples, the 3D IC 1205 includes three or more vertically stacked IC dies, such as the 3D IC 1100. In some embodiments, the 3D IC 1205 implements a neural network that has gone through a machine-learning process to train its configurable components to perform a certain task (e.g., to perform face recognition).

As shown, the 3D IC 1205 includes a case 1250 (sometimes called a cap or epoxy packaging) that encapsulates the dies 1202 and 1204 of this IC in a secure housing 1215. On the back side of the die 1204 one or more interconnect layers 1206 are defined to connect the 3D IC to a ball grid array 1220 that allows this to be mounted on a printed circuit board 1230 of the device 1200. In some embodiments, the 3D IC includes packaging with a substrate on which the die 1204 is mounted (i.e., between the ball grid array and the IC die 1204), while in other embodiments this packaging does not have any such substrate.

Some embodiments of the invention provide an integrated circuit (IC) with a defect-tolerant neural network. The neural network has one or more redundant neurons in some embodiments. After the IC is manufactured, a defective neuron in the neural network can be replaced by a redundant neuron (i.e., the redundant neuron can be assigned the operation of the defective neuron). The routing fabric of the neural network can be reconfigured so that it re-routes signals around the discarded, defective neuron. In some embodiments, the re-configured routing fabric does not provide any signal to or forward any signal from the discarded, defective neuron, and instead provides signals to and forwards signals from the redundant neuron that takes the defective neuron's position in the neural network.

In the embodiments that implement a neural network by re-purposing (i.e., reconfiguring) one or more individual neurons to implement neurons of multiple stages of the neural network, the IC discards a defective neuron by removing it from the pool of neurons that it configures to perform the operation(s) of neurons in one or more stages of neurons, and assigning this defective neuron's configuration(s) (i.e., its machine-trained parameter set(s)) to a redundant neuron. In some of these embodiments, the IC would re-route around the defective neuron and route to the redundant neuron, by (1) supplying machine-trained parameters and input signals (e.g., previous stage neuron outputs) to the redundant neuron instead of supplying these parameters and signals to the defective neuron, and (2) storing the output(s) of the defective neuron instead of storing the output(s) of the defective neuron.

Figure 13:
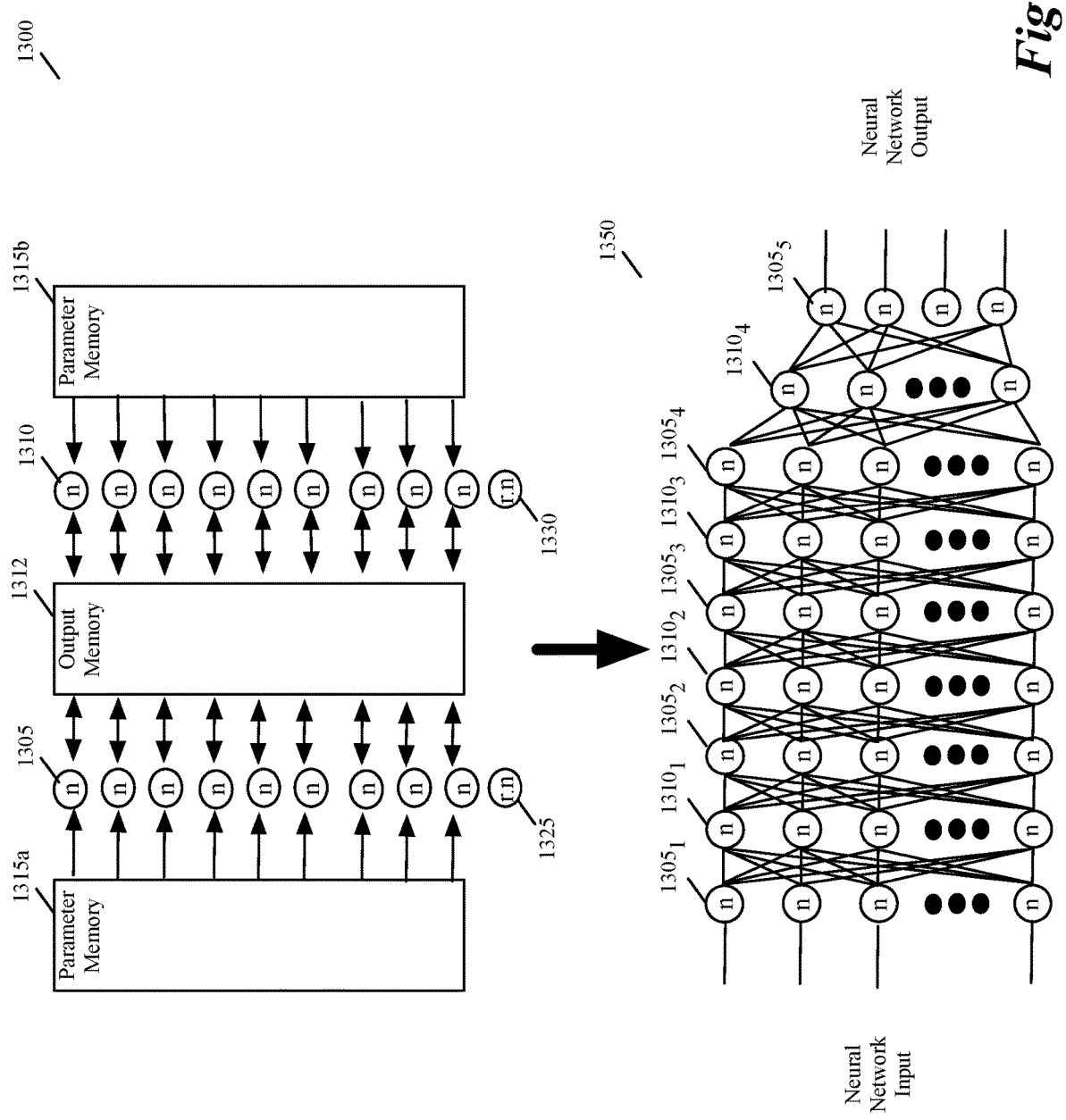
FIGS. 13 and 14 illustrate examples of the implementation of a neural network by re-purposing (i.e., reconfiguring) one or more individual neurons to implement neurons of multiple stages of the neural network.
Figure 14:
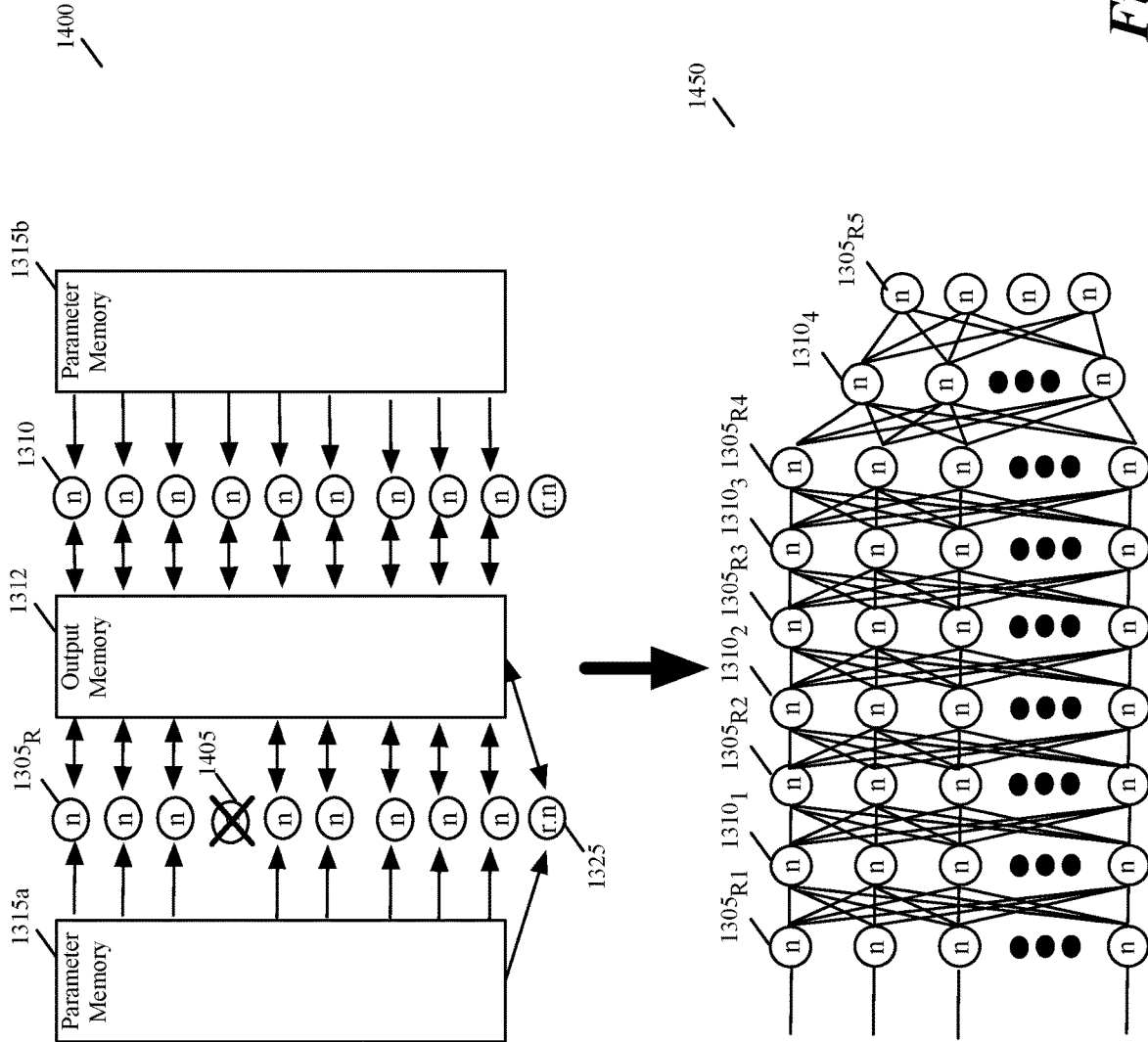

FIGS. 13 and 14 illustrate an example of one such neural network. These figures show a machine-trained circuit 1300 that has two sets of neurons 1305 and 1310 that are re-purposed (reconfigured) to implement a multi-stage neural network 1350. In this example, the neural network 1350 has nine layers. Each of these neuron sets has one redundant neuron 1325 or 1330 to replace any defective neuron in its set, as further described below.

The machine-trained circuit 1300 has two parameter memories 1315a and 1315b that respectively store machine-trained parameters for the neuron sets 1305 and 1310. These machine-trained parameters iteratively configure each neuron set to implement a different stage in the multi-stage network. In the example illustrated in FIG. 13, the parameters in memory 1315a store parameters that sequentially re-configure the neuron set 1305 to implement the odd neuron layers (i.e., the first, third, fifth, seventh and ninth layers) of the neural network, while the memory 1315b stores parameters that sequentially re-configure the neuron set 1310 to implement the even neuron layers (i.e., the second, fourth, sixth and eight layers). The parameters in the memories 1315a and 1315b were generated through machine-learning processes, and configure the neurons in the sets 1305 and 1310 to perform a set of one or more operations (e.g., to perform face recognition or voice recognition).

The machine-trained circuit 1300 also has an output memory 1312. The output of each neuron is stored in the output memory 1312. With the exception of the neurons in the first neuron stage, the inputs of the neurons in the other stages are retrieved from the output memory. Based on their inputs, the neurons compute their outputs, which again are stored in the output memory 1312 for feeding the next stage neurons (when intermediate neurons compute the outputs) or for providing the output of the neural network (when the final stage neurons compute their outputs).

In some embodiments, all the components 1305, 1310, 1312, and 1315 of the circuit 1300 are on one bonded layer (e.g., one IC die or wafer). In other embodiments, different components are on different layers. For instance, the neurons 1305 and 1310 can be on a different IC die than the IC die that includes one of the memories 1312 or 1315, or both memories 1312 and 1315. Alternatively, in some embodiments, the neurons 1305 are on one IC die while the neurons 1310 are on another IC die. In some of these embodiments, the IC die of neurons 1305 or neurons 1310 also include one or both of the parameter and output memories.

In the example illustrated in FIG. 13, none of the neurons are defective. Hence, the redundant neurons 1325 and 1330 are not used to implement any of the neuron stages of the neural network 1350. FIG. 14, however, illustrates an example where one neuron 1405 in the first neuron set 1305 is defective and a neural network 1450 is implemented by using the redundant neuron 1325 of the first neuron set 1305. This figure illustrates a machine-trained circuit 1400 that is identical to the machine-trained circuit 1300, except that the neuron 1405 in the first neuron set 1305 is defective.

To address this defect, a defect-curing process that configures the circuit 1400 removes the defective neuron 1405 from the first neuron set and replaces this defective neuron with the redundant neuron 1325 of this set. The defect-curing process assigns to the redundant neuron the machine-trained parameters that would have been assigned to the defective neuron, in order to allow this neuron to implement one of the neurons in the odd stages of the neural network 1450. This process also changes the storage and retrieval logic of the machine-trained circuit 1400 to ensure that the redundant neuron 1325 receives the desired input from and stores its output in the output memory 1312. FIG. 14 shows the neural network 1450 implemented with the set of neurons 1305R implementing the odd stages of this network. Here, the designation R is indicative that the neuron set 1305 is using its redundant neuron 1325.

Figure 15:
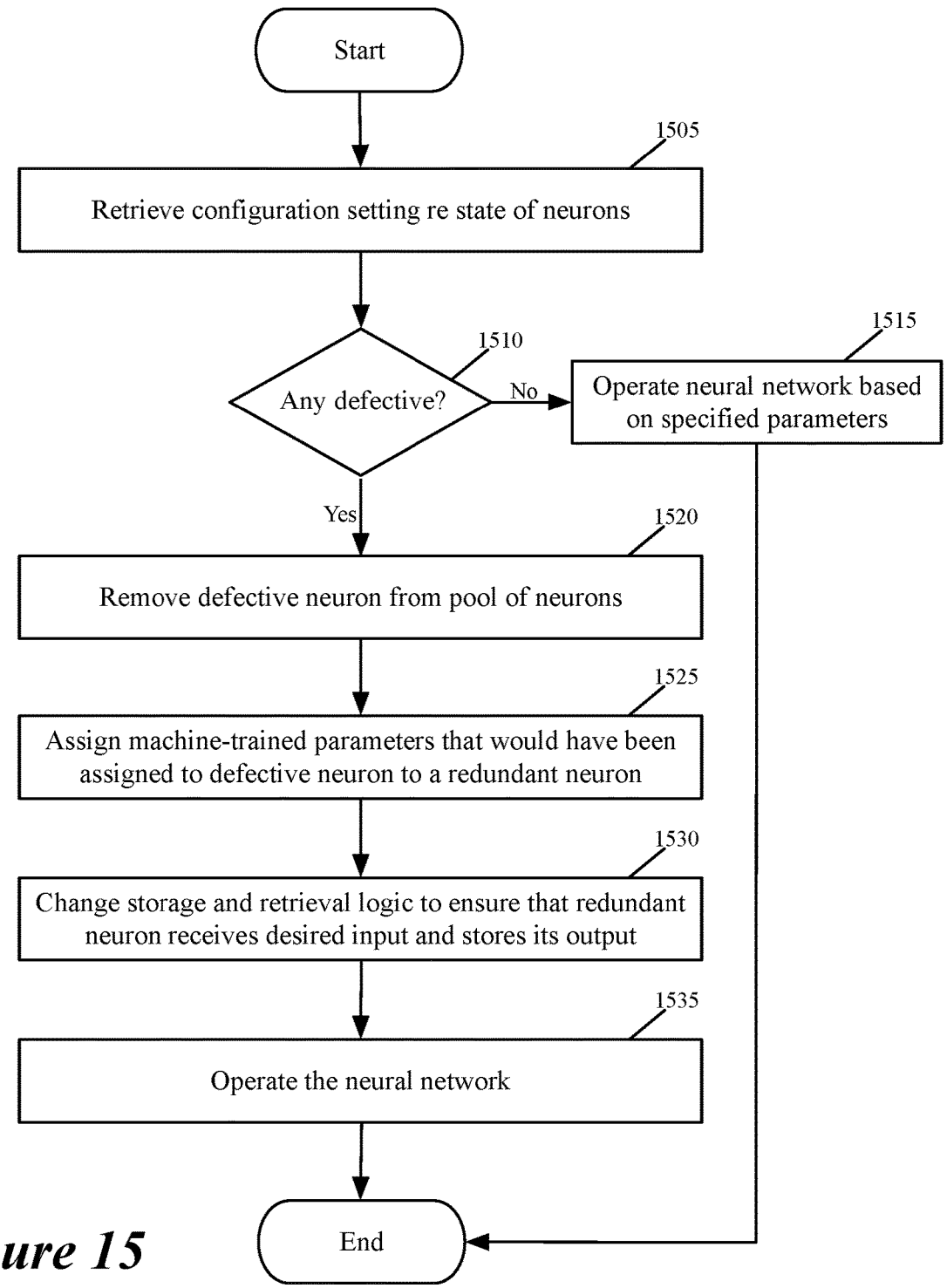
FIG. 15 conceptually illustrates a defect-curing process.

FIG. 15 illustrates a defect-curing process 1500 of some embodiments. In some embodiments, this process is performed each time the IC with the neural network is initializing (i.e., is powering up). The process 1500 initially determines (at 1505) whether a setting stored on the IC indicates that one or more neurons are defective. In some embodiments, this setting is stored in a ROM of the IC during a testing phase of the IC after it has been manufactured. This testing phase identifies defective neurons and stores the identity of the defective neuron on the ROM in some embodiments. If only one redundant neuron exists for each neuron set (e.g., 1305 or 1310) of the IC, the testing process in some embodiments discards any IC with more than one defective neuron in each neuron set.

When the setting does not identify any defective neuron, the process 1500 loads (at 1515) the settings that allow the neurons to be configured with a user-design that has been provided in order to configure the neural network to implement a set of operations. After 1515, the process ends. On the other hand, when the setting identifies a defective neuron, the process 1500 removes (at 1520) the defective neuron from the pool of neurons, and replaces (at 1520) this defective neuron with the redundant neuron. The defect-curing process then assigns (at 1525) to the redundant neuron the machine-trained parameters that would have been assigned to the defective neuron to allow this neuron to implement operations of the defective neuron that are needed to implement the neural network. At 1530, the process changes the storage and retrieval logic of the machine-trained circuit to ensure that the redundant neuron receives the desired input from and stores its output in the output memory. Finally, at 1535, the process 1500 directs the neural network to start operating based on the new settings that were specified at 1525 and 1530. After 1335, the process ends.

While the invention has been described with reference to numerous specific details, one of ordinary skill in the art will recognize that the invention can be embodied in other specific forms without departing from the spirit of the invention. For instance, one of ordinary skill will understand that while several embodiments of the invention have been described above by reference to machine-trained neural networks with neurons, other embodiments of the invention are implemented on other machine-trained networks with other kinds of machine-trained processing nodes.

The 3D circuits and ICs of some embodiments have been described by reference to several 3D structures with vertically aligned IC dies. However, other embodiments are implemented with a myriad of other 3D structures. For example, in some embodiments, the 3D circuits are formed with multiple smaller dies placed on a larger die or wafer. Also, some embodiments are implemented in a 3D structure that is formed by vertically stacking two sets of vertically stacked multi-die structures. Therefore, one of ordinary skill in the art would understand that the invention is not to be limited by the foregoing illustrative details, but rather is to be defined by the appended claims.

The invention claimed is:

1. A three-dimensional (3D) circuit comprising:
a first bonded layer;
a second bonded layer vertically stacked with the first bonded layer; and
a machine-trained network comprising a plurality of machine-trained processing (MTP) nodes,
said network comprising a first arrangement of MTP nodes on the first bonded layer and a second arrangement of MTP nodes on the second bonded layer.

2. The 3D circuit of claim 1, wherein the processing nodes of first and second sub-networks are neurons and the first and second sub-networks are two sub-networks of a machine-trained neural network.

3. The 3D circuit of claim 1, wherein:
the outputs of at least a first subset of MTP nodes in the first arrangement are supplied to circuits on the second bonded layer through a vertical conductive interface between the first and second bonded layers; and
the outputs of at least a first subset of MTP nodes in the second arrangement are supplied to circuits on the first bonded layer through the vertical conductive interface between the first and second bonded layers.

4. The 3D circuit of claim 1, wherein:
the inputs of at least a first subset of MTP nodes in the first arrangement are received from circuits on the second bonded layer through a vertical conductive interface between the first and second bonded layers; and
the inputs of at least a first subset of MTP nodes in the second arrangement are received from circuits on the first bonded layer through the vertical conductive interface between the first and second bonded layers.

5. The 3D circuit of claim 4, wherein the vertical conductive interface comprises through-silicon vias (TSVs) or direct bonded interconnects (DBIs).

6. The 3D circuit of claim 1, wherein at least one bonded layer is an integrated circuit (IC) die and the other bonded layer is an IC wafer.

7. The 3D circuit of claim 1, wherein the first and second bonded layers are first and second integrated circuit (IC) dies.

8. The 3D circuit of claim 7, wherein the 3D circuit further comprises a package that includes a case that encapsulates the first and second dies within one housing.

9. The 3D circuit of claim 1, wherein the first and second bonded layers are first and second integrated circuit (IC) wafers.

10. The 3D circuit of claim 1, wherein each bonded layer comprises (i) an integrated circuit substrate on which a plurality of circuit components are defined and (ii) a plurality of wiring layers for connecting the circuit components.

11. A device comprising:
a printed circuit board; and
a three-dimensional (3D) integrated circuit (IC) chip mounted on the printed circuit board, the 3D IC chip comprising:
a first IC die;
a second IC die vertically stacked with the first IC die; and
a machine-trained network comprising a plurality of machine-trained processing (MTP) nodes,
said network comprising a first arrangement of MTP nodes on the first IC die and a second arrangement of MTP nodes on the second IC die.

12. The device of claim 11, wherein the processing nodes of first and second sub-networks are neurons and the first and second sub-networks are two sub-networks of a machine-trained neural network.

13. The device of claim 11, wherein:
the outputs of at least a first subset of MTP nodes in the first arrangement are supplied to circuits on the second IC die through vertical connections between the first and second IC dies; and
the outputs of at least a first subset of MTP nodes in the second arrangement are supplied to circuits on the first IC die through vertical connections between the first and second IC dies.

14. A three-dimensional (3D) circuit comprising:
a first bonded layer; and
a second bonded layer vertically stacked with the first bonded layer,
wherein the first bonded layer comprises a machine-trained network comprising an arrangement of machine-trained processing nodes.

15. The 3D circuit of claim 14, wherein at least one bonded layer is an integrated circuit (IC) die and the other bonded layer is an IC wafer.

16. The 3D circuit of claim 14, wherein the first and second bonded layers are first and second integrated circuit (IC) dies.

17. The 3D circuit of claim 14, wherein the first and second bonded layers are first and second integrated circuit (IC) wafers.

18. The 3D circuit of claim 14, wherein the second bonded layer includes a memory that is connected to the machine-trained network through a vertical conductive interface.

19. The 3D circuit of claim 18, wherein the memory includes a plurality of memory arrays and at least two of the memory arrays are connected to the machine-trained network through the vertical conductive interface.

20. The 3D circuit of claim 14,
wherein the machine-trained network is a first machine-trained sub-network with a first set of machine-trained processing nodes,
wherein the second bonded layer includes a second machine-trained sub-network that comprises a second set of machine-trained processing nodes and that is connected to the first machine-trained sub-network on the first IC through a vertical conductive interface.

21. The 3D circuit of claim 14, wherein circuits on the second bonded layer are connected to the machine-trained network on the first bonded layer through a vertical conductive interface.

\* \* \* \* \*